United States Patent
Lin et al.

(10) Patent No.: US 11,121,039 B2
(45) Date of Patent: *Sep. 14, 2021

(54) FINFET STRUCTURES AND METHODS OF FORMING THE SAME

(71) Applicant: Taiwan Semiconductor Manufacturing Company, Ltd., Hsinchu (TW)

(72) Inventors: Chih-Han Lin, Hsinchu (TW); Jr-Jung Lin, Hsinchu (TW); Chun-Hung Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 75 days.

This patent is subject to a terminal disclaimer.

(21) Appl. No.: 16/583,747

(22) Filed: Sep. 26, 2019

(65) Prior Publication Data
US 2020/0020593 A1 Jan. 16, 2020

Related U.S. Application Data

(60) Continuation of application No. 15/899,185, filed on Feb. 19, 2018, now Pat. No. 10,468,308, which is a
(Continued)

(51) Int. Cl.
*H01L 29/76* (2006.01)
*H01L 29/94* (2006.01)
(Continued)

(52) U.S. Cl.
CPC .......... *H01L 21/823481* (2013.01); *H01L 21/823431* (2013.01); *H01L 21/823437* (2013.01);
(Continued)

(58) Field of Classification Search
CPC ..... H01L 21/823431; H01L 21/823437; H01L 21/823481; H01L 21/823821;
(Continued)

(56) References Cited

U.S. PATENT DOCUMENTS 7,667,271 B2 2/2010 Yu et al.
7,910,453 B2 3/2011 Xu et al.
(Continued)

FOREIGN PATENT DOCUMENTS

| CN | 104681557 A | 6/2015 |
| CN | 105009275 A | 10/2015 |
| CN | 103219340 B | 4/2016 |

*Primary Examiner* — Theresa T Doan
(74) *Attorney, Agent, or Firm* — Slater Matsil, LLP

(57) ABSTRACT

An embodiment is a method including forming a first fin in a first region of a substrate and a second fin in a second region of the substrate, forming a first isolation region on the substrate, the first isolation region surrounding the first fin and the second fin, forming a first dummy gate over the first fin and a second dummy gate over the second fin, the first dummy gate and the second dummy gate having a same longitudinal axis, replacing the first dummy gate with a first replacement gate and the second dummy gate with a second replacement gate, forming a first recess between the first replacement gate and the second replacement gate, and a filling an insulating material in the first recess to form a second isolation region.

20 Claims, 44 Drawing Sheets

Related U.S. Application Data division of application No. 15/144,185, filed on May 2, 2016, now Pat. No. 9,899,266.

(51) Int. Cl.
*H01L 21/8234* (2006.01)
*H01L 29/78* (2006.01)
*H01L 29/66* (2006.01)
*H01L 21/8238* (2006.01)
*H01L 29/165* (2006.01)

(52) U.S. Cl.
CPC .......... *H01L 21/823821* (2013.01); *H01L 21/823828* (2013.01); *H01L 21/823878* (2013.01); *H01L 29/165* (2013.01); *H01L 29/66545* (2013.01); *H01L 29/66795* (2013.01); *H01L 29/785* (2013.01)

(58) Field of Classification Search
CPC ..... H01L 21/823828; H01L 21/823878; H01L 29/165; H01L 29/66545; H01L 29/66795; H01L 29/785
USPC ........................................................ 257/401
See application file for complete search history.

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 10,468,308 B2 * | 11/2019 | Lin ................ H01L 21/823878 |
| 2013/0187237 A1 | 7/2013 | Yu et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0264610 A1 | 9/2014 | Yang et al. |
| 2015/0236131 A1 | 8/2015 | Chang et al. |
| 2015/0303118 A1 | 10/2015 | Wang et al. |
| 2016/0268392 A1 | 9/2016 | Zhu |
| 2019/0252383 A1 * | 8/2019 | Lin ...................... H01L 29/495 |

\* cited by examiner

FINFET STRUCTURES AND METHODS OF FORMING THE SAME

PRIORITY CLAIM AND CROSS-REFERENCE

This application is a continuation of U.S. patent application Ser. No. 15/899,185, entitled "FINFET Structures and Methods of Forming the Same," filed on Feb. 19, 2018, which is a divisional of U.S. patent application Ser. No. 15/144,185, entitled "FINFET Structures and Methods of Forming the Same," filed on May 2, 2016, which applications are hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, Fin Field-Effect Transistors (FinFETs) or multiple gate transistors are being researched and implemented. However, with this new device structure and the continuous shrinking of even FinFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
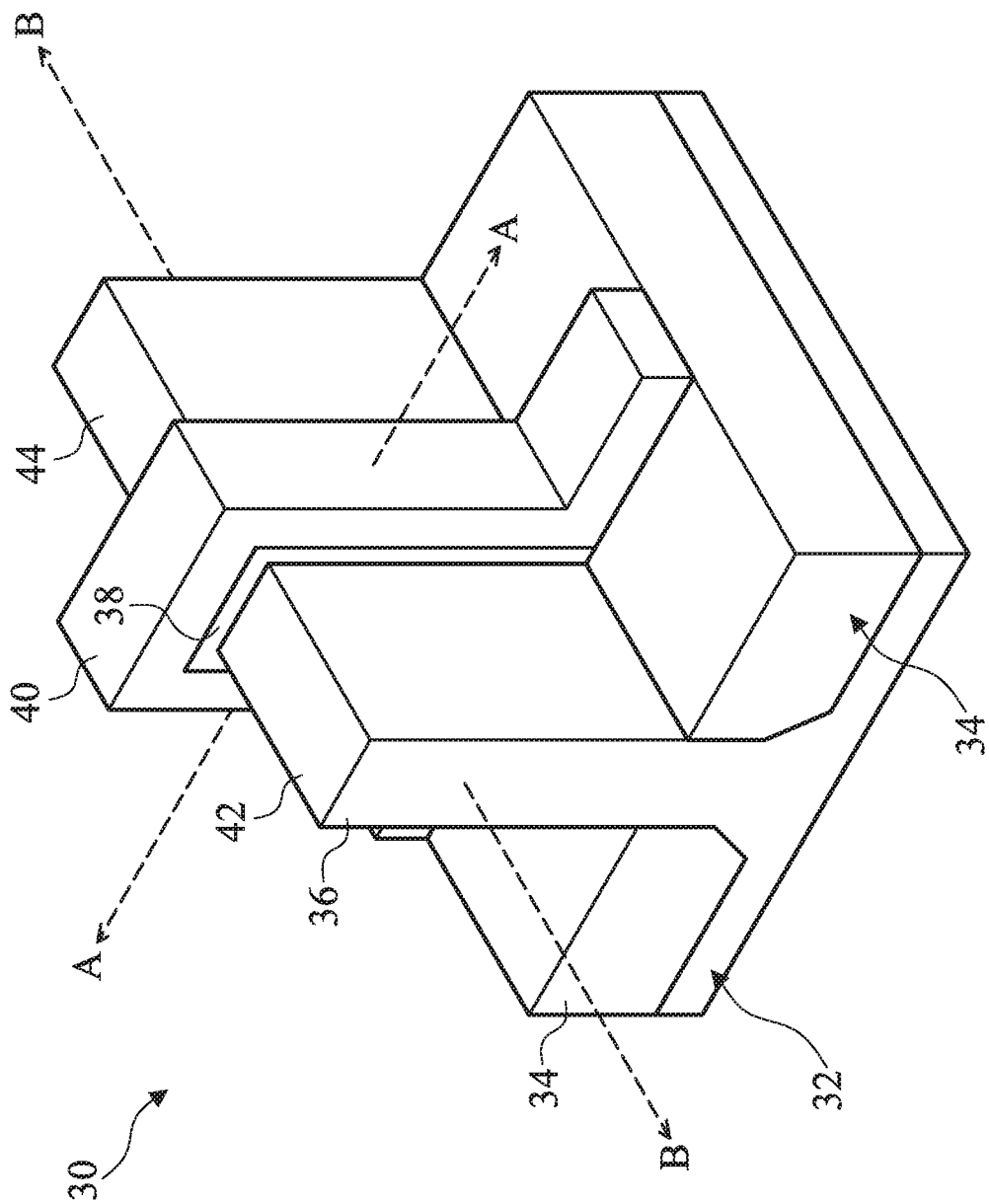
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. In addition, embodiments contemplate aspects that can be used in other types of devices, such as planar devices and/or gate all-around (GAA) devices, such as GAA FETs. In particular, FETs are described herein having an improved gate isolation structure and method of forming the gate isolation structure. Intermediate stages of forming FinFETs are illustrated. Some embodiments discussed herein are discussed in the context of FETs formed using a gate-last process. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the FinFET 30. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2 through 20B are cross-sectional views, three-dimensional views, and top views of intermediate stages in the manufacturing of FinFETs in accordance with an exemplary embodiment. FIGS. 2 through 6 illustrate reference cross-section A-A illustrated in FIG. 1, except for multiple FinFETs. In FIGS. 7A through 20B, figures ending with an "A" designation are illustrated along cross-section A-A; figures ending with a "B" designation are illustrated along cross-section B-B; figures ending with a "C" designation are three-dimensional views; and FIG. 19D is a top-view of a portion of FIG. 19C.

Figure 2:
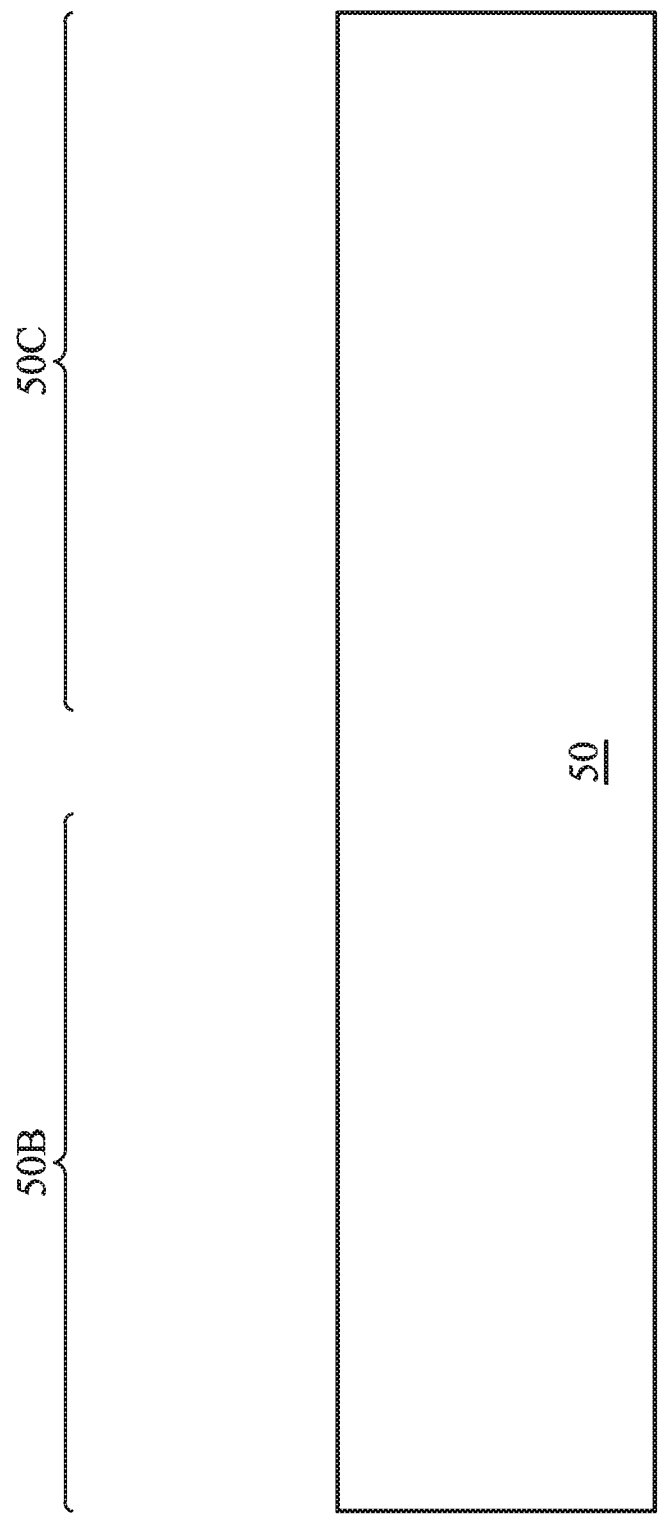
FIGS. 2 through 6, 7A-7B, 8A-8B, 9A-9B, 10A-10B, 11A-11C, 12A-12C, 13A-13C, 14A-14C, 15A-15C, 16A-16C, 17A-17C, 18A-18C, 19A-19D, and 20A-20B are cross-sectional views, three-dimensional views, and top views of intermediate stages in the manufacturing of FinFETs in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as NMOS transistors, such as n-type FinFETs. The second region 50C can be for forming p-type devices, such as PMOS transistors, such as p-type FinFETs. In some embodiments, both the first and second regions 50B and 50C are used to form the same type of devices, such as both regions being for n-type devices or p-type devices.

Figure 3:
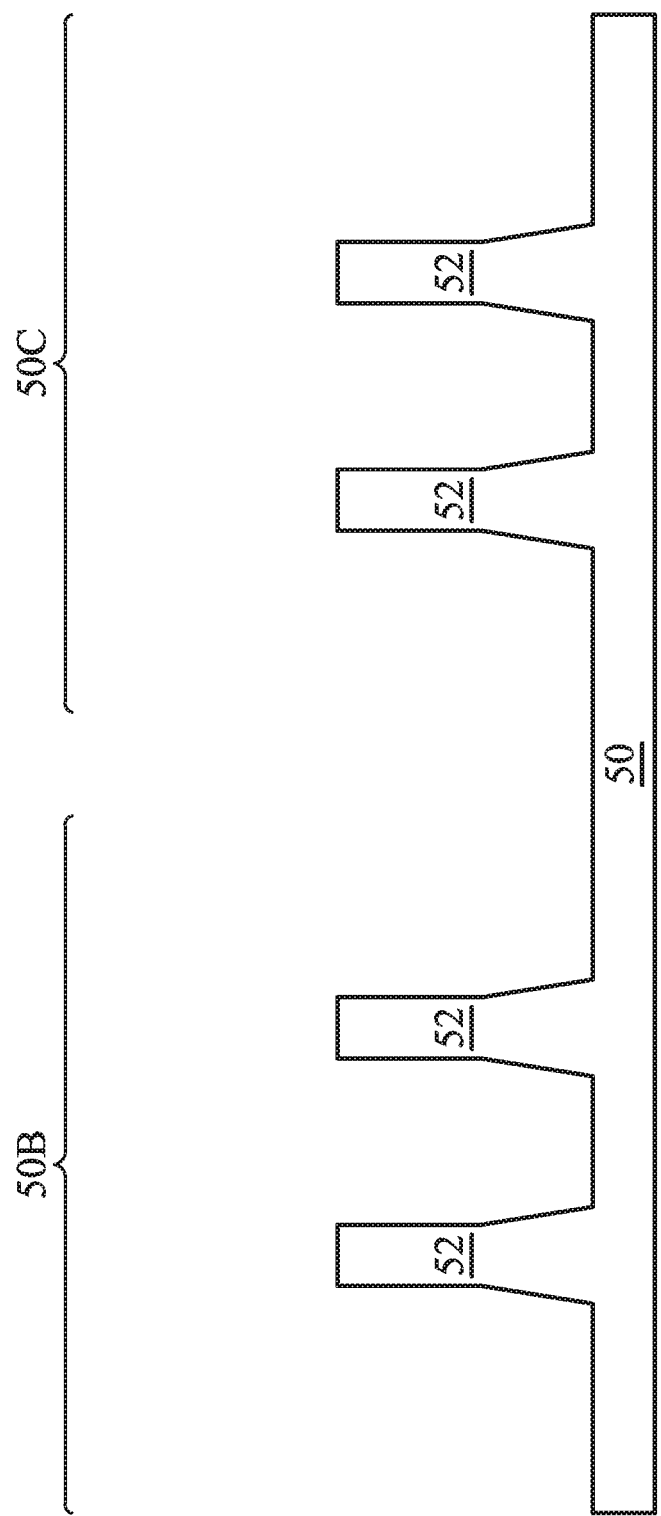
Figure 4:
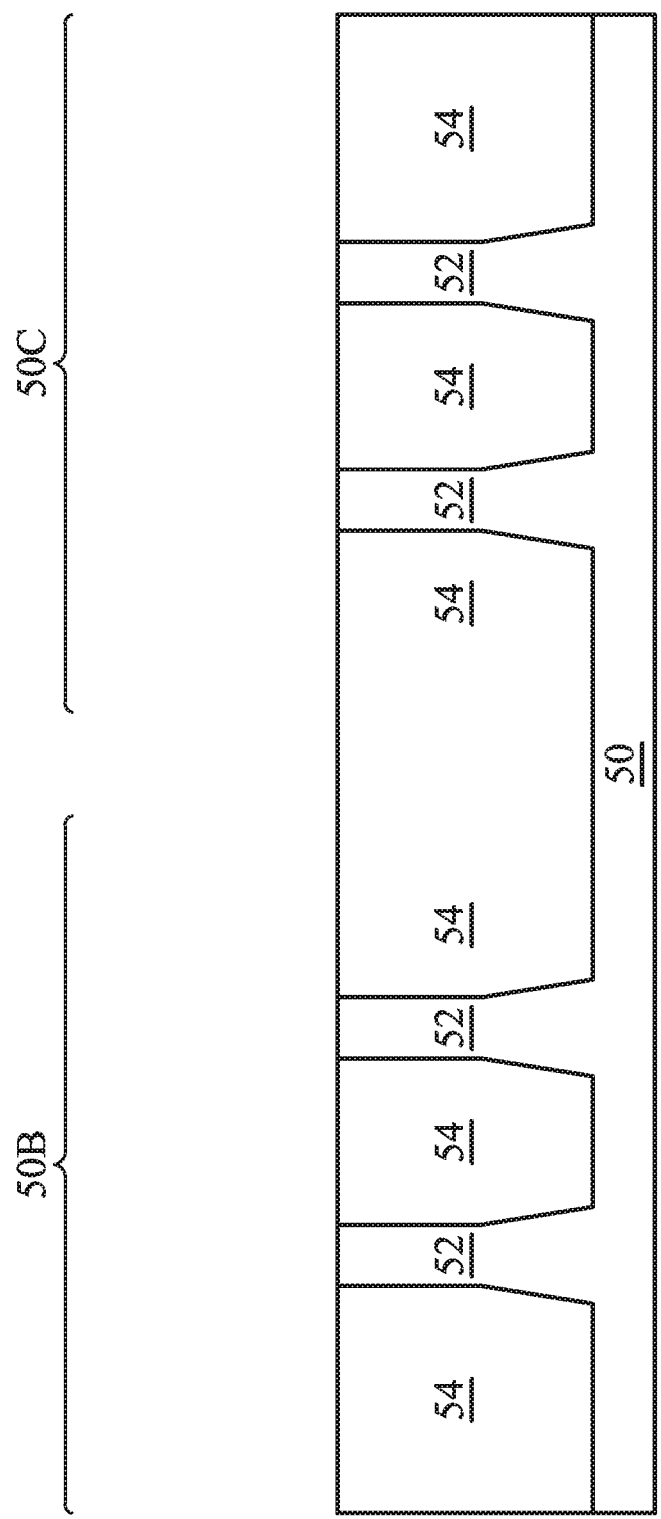

FIGS. 3 and 4 illustrate the formation of fins 52 and isolation regions 54 between neighboring fins 52. In FIG. 3, fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4, an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. The insulating material 54 may be referred to as isolation regions 54. Further in FIG. 4, a planarization process, such as a chemical mechanical polish (CMP), may remove any excess insulation material 54 and form top surfaces of the isolation regions 54 and top surfaces of the fins 52 that are level.

Figure 5:
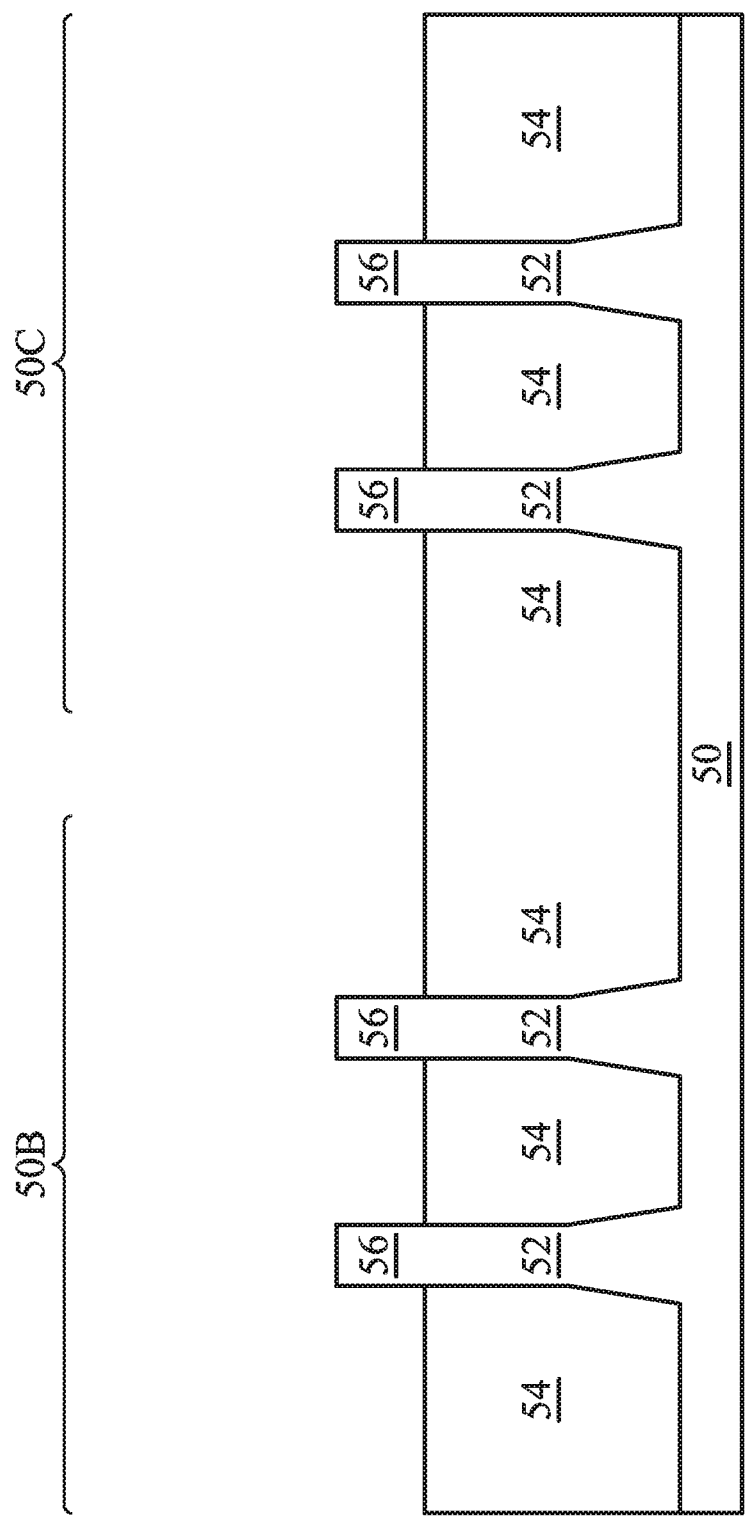

In FIG. 5, the isolation regions 54 are recessed, such as to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 5, appropriate wells may be formed in the fins 56, fins 52, and/or substrate 50. In some embodiments, a P well may be formed in the first region 50B, and an N well may be formed in the second region 50C. In some other embodiments, a P well or an N well are formed in both the first and second regions 50B and 50C.

In the embodiments with different well types, the different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region 50C, such as the PMOS region. The p-type impurities may be boron, $BF_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the first region 50B and the second region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 6:
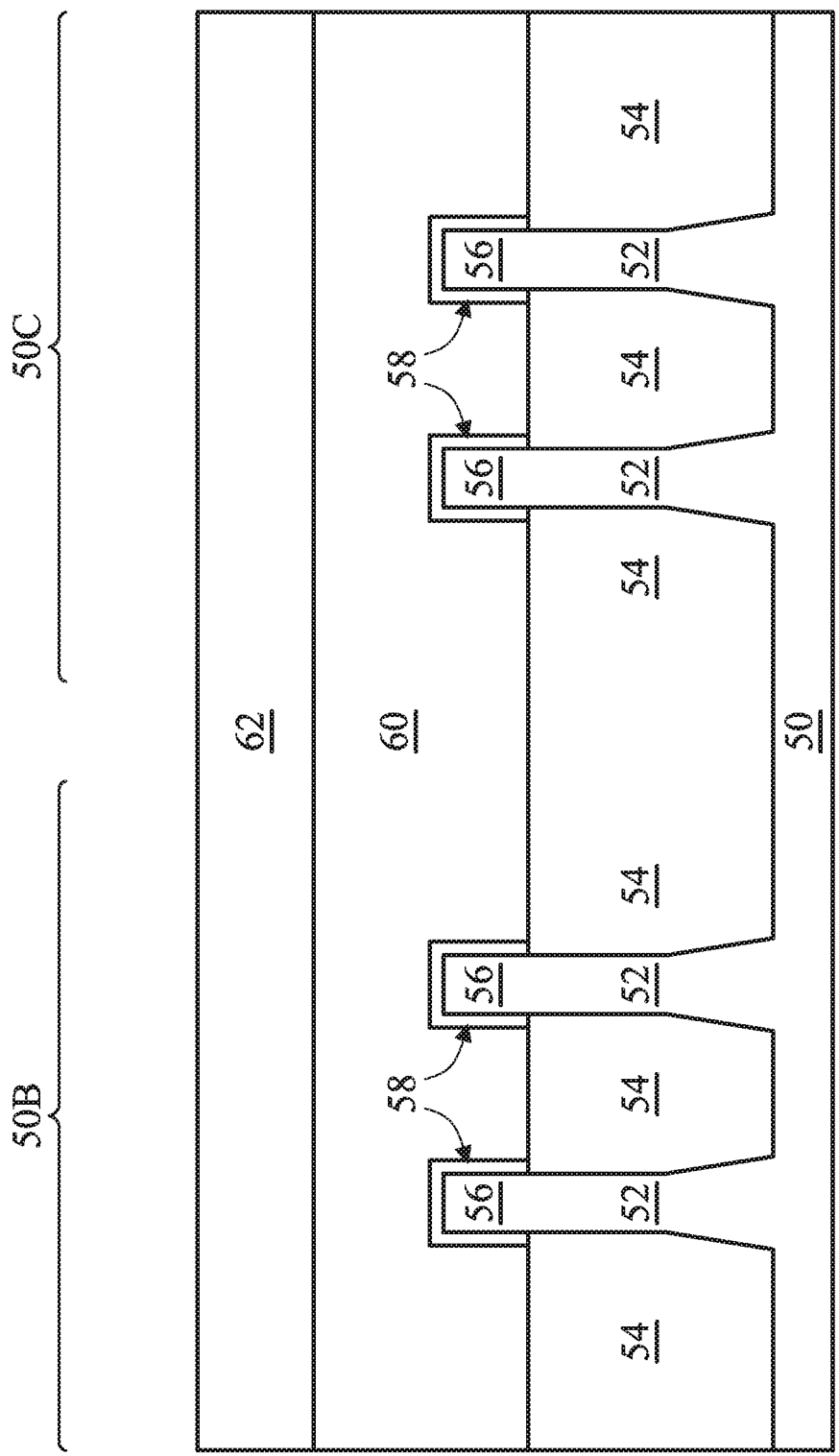

In FIG. 6, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may comprise a conductive material and may be selected from a group comprising polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 60 may be deposited by physical vapor deposition (PVD), CVD, sputter deposition, or other techniques known and used in the art for depositing conductive materials. The dummy gate layer 60 may be made of other materials that have a high etching selectivity from the etching of isolation regions. The mask layer 62 may include, for example, SiN, SiON, or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 7A:
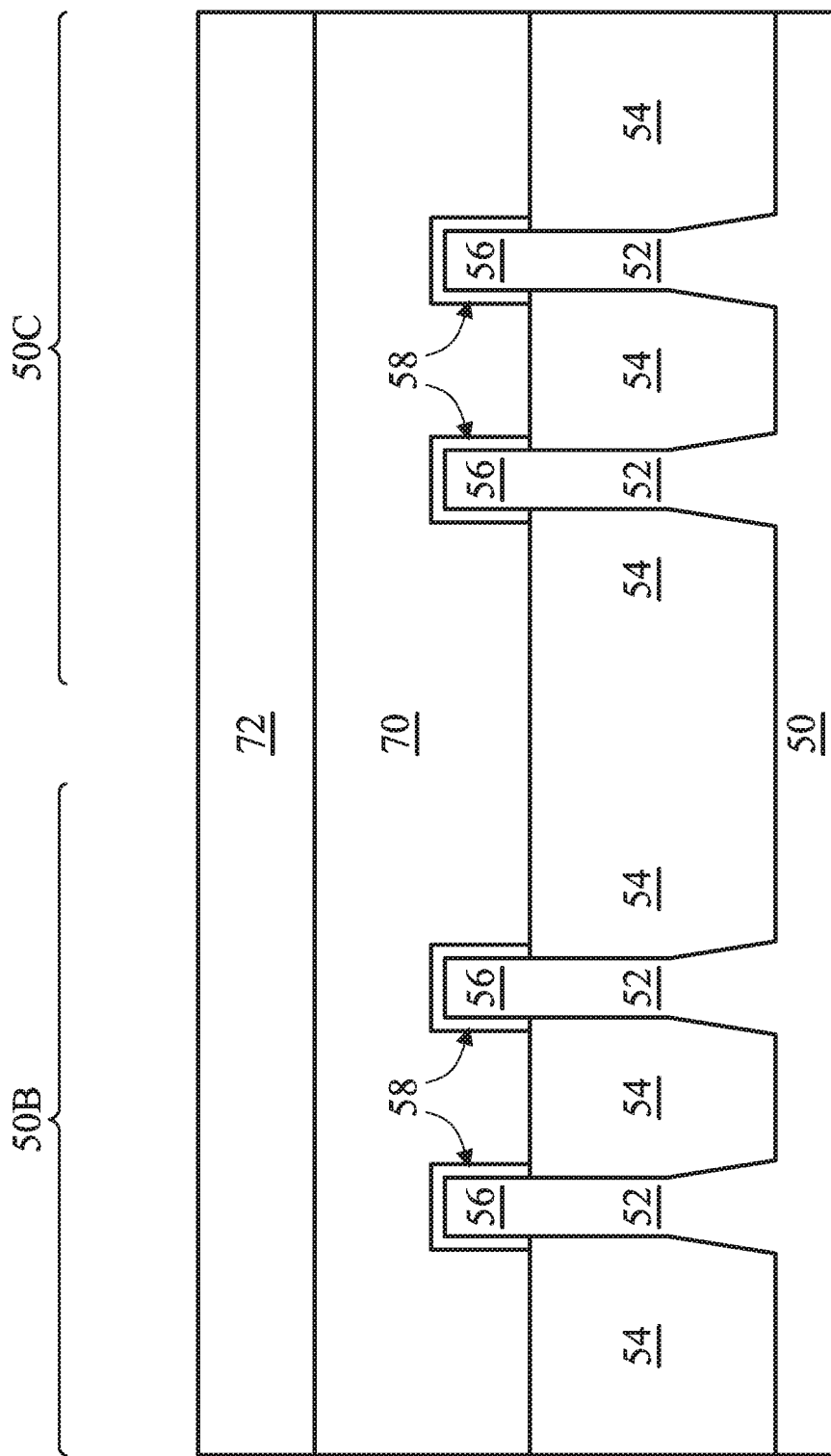
Figure 7B:
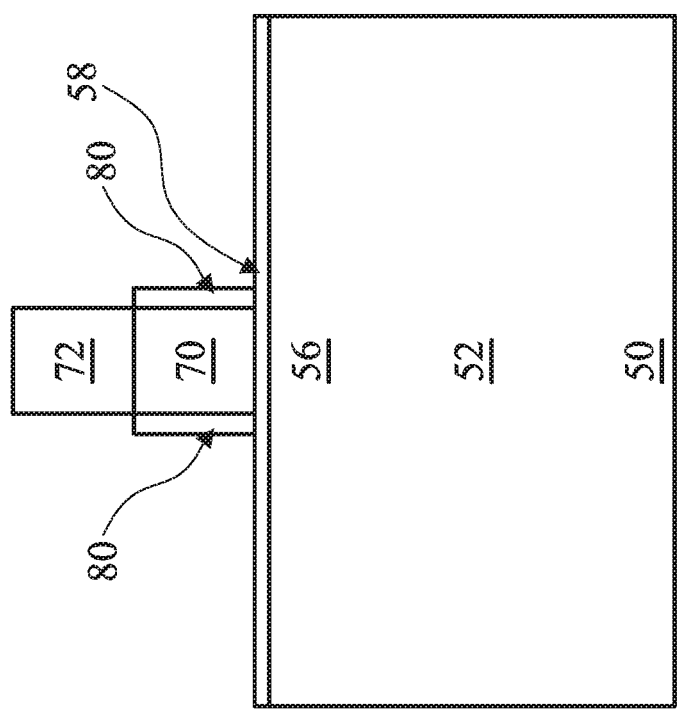

In FIGS. 7A and 7B, the mask layer 62 may be patterned using acceptable photolithography and etching techniques to form masks 72. The pattern of the masks 72 then may be transferred to the dummy gate layer 60 and dummy dielectric layer 58 by an acceptable etching technique to form dummy gates 70. The dummy gates 70 cover respective channel regions of the fins 56. The dummy gates 70 may also have a lengthwise direction substantially perpendicular to the lengthwise direction of respective epitaxial fins.

Figure 8A:
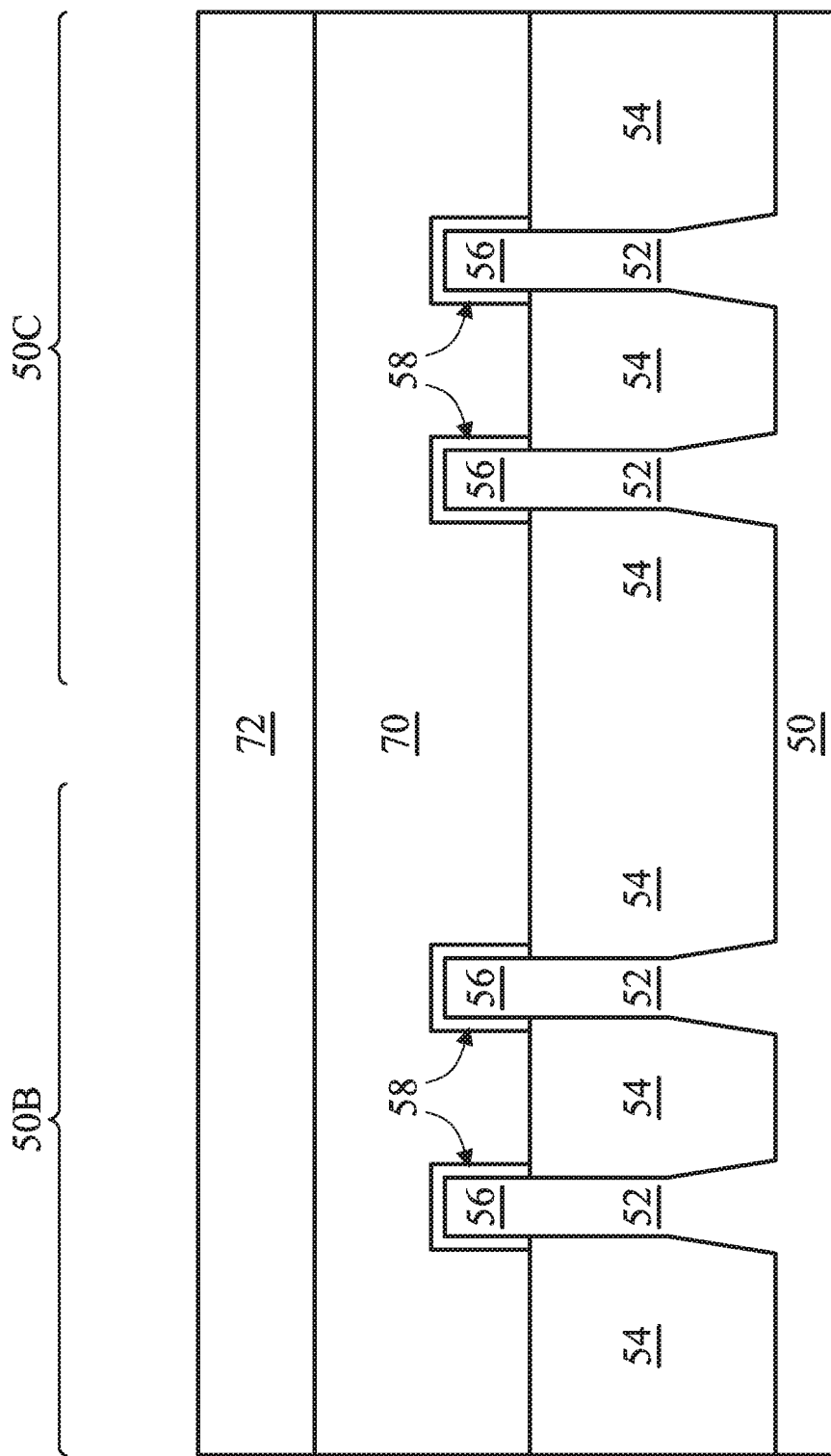
Figure 8B:
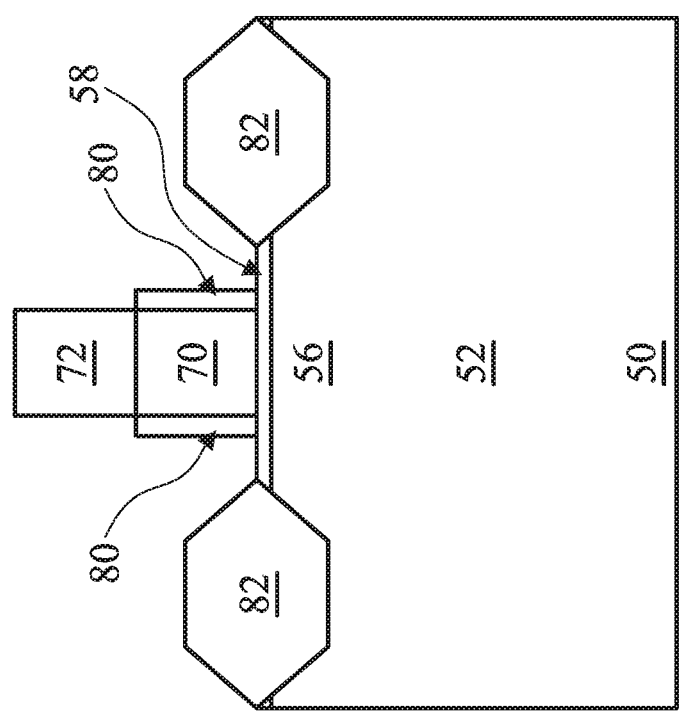

In FIGS. 8A and 8B, gate seal spacers 80 can be formed on exposed surfaces of dummy gates 70 and/or fins 56. A thermal oxidation or a deposition followed by an anisotropic etch may form the gate seal spacers 80.

After the formation of the gate seal spacers 80, implants for lightly doped source/drain (LDD) regions may be performed. In the embodiments with different device types, similar to the implants discussed above in FIG. 5, a mask, such as a photoresist, may be formed over the first region 50B, while exposing the second region 50C, and appropriate type (e.g., n-type or p-type) impurities may be implanted into the exposed fins 56 in the second region 50C. The mask may then be removed. Subsequently, a mask, such as a photoresist, may be formed over the second region 50C while exposing the first region 50B, and appropriate type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 8A and 8B, epitaxial source/drain regions 82 are formed in the fins 56. The epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52.

In the embodiments with different device types, the epitaxial source/drain regions 82 in the regions may be formed in separated processes. In these embodiments, the epitaxial source/drain regions 82 in the first region 50B may be formed by masking the second region 50C and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. If the first region 50B is an n-type device region, the epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. If the first region 50B is a p-type device region, the epitaxial source/drain regions 82 may include any acceptable material, such as appropriate for p-type FinFETs. For example, if the fin 56 is silicon, the epitaxial source/drain regions 82 may comprise SiGe, SiGeB, Ge, GeSn, or the like. The epitaxial source/drain regions 82 in the first region 50B may have surfaces raised from respective surfaces of the fins 56 and may have facets. Subsequently, the dummy gate spacers in the first region 50B are removed, for example, by an etch, as is the mask on the second region 50C.

After the formation of the epitaxial source/drain regions 82 in the first region 50B, the epitaxial source/drain regions 82 in the second region 50C may be formed by masking the first region 50B and conformally depositing a dummy spacer layer in the second region 50C followed by an anisotropic etch to form dummy gate spacers (not shown) along sidewalls of the dummy gates 70 and/or gate seal spacers 80 in the second region 50C. Then, source/drain regions of the epitaxial fins in the second region 50C are etched to form recesses. The epitaxial source/drain regions 82 in the second region 50C are epitaxially grown in the recesses. The epitaxial source/drain regions 82 in the second region 50C may include any acceptable material, such as appropriate for p-type FinFETs or n-type FinFETs, as described above. The epitaxial source/drain regions 82 in the second region 50C may have surfaces raised from respective surfaces of the fins 56 and may have facets. Subsequently, the dummy gate spacers in the second region 50C are removed, for example, by an etch, as is the mask on the first region 50B.

Figure 9A:
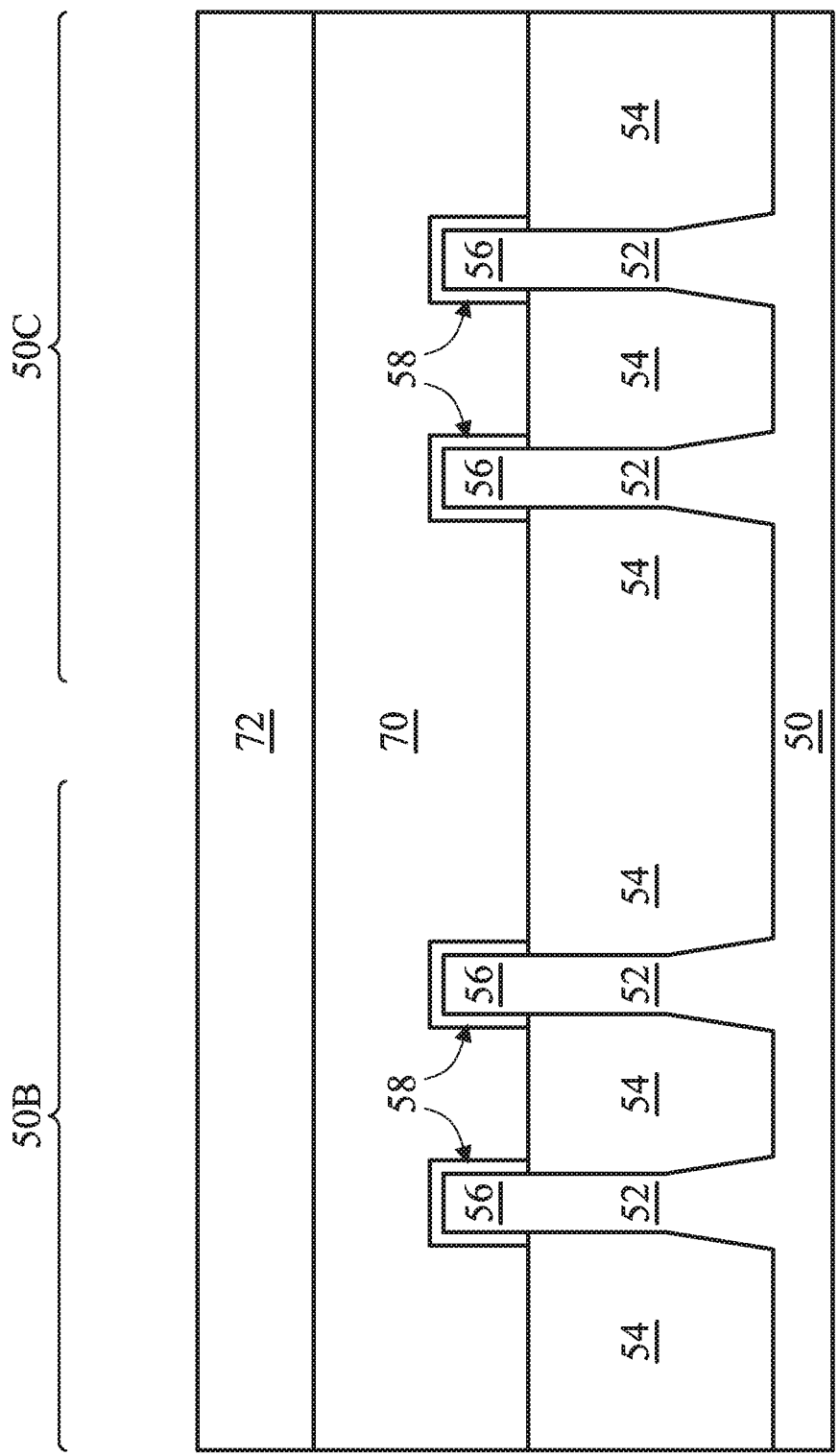
Figure 9B:
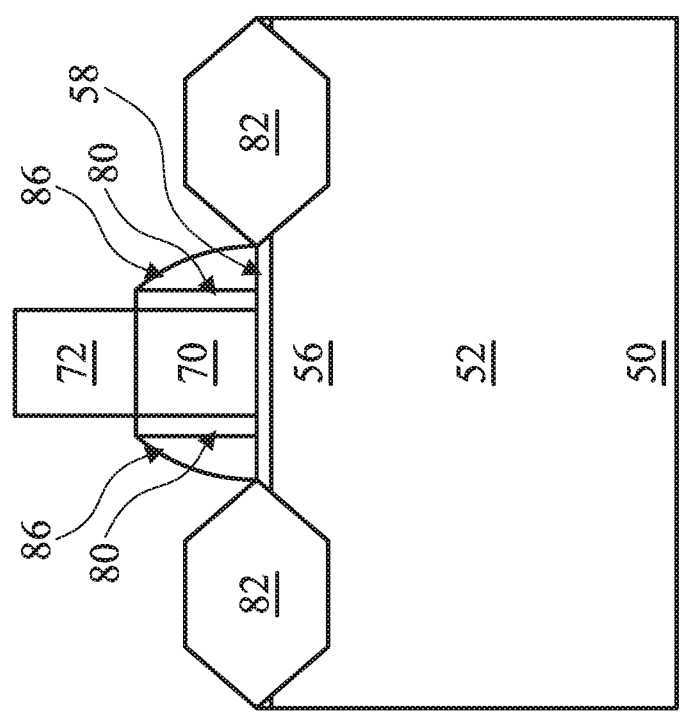

In FIGS. 9A and 9B, gate spacers 86 are formed on the gate seal spacers 80 along sidewalls of the dummy gates 70. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and/or epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of impurities previously discussed. In other embodiments, the epitaxial source/drain regions 82 may be in situ doped during growth.

Figure 10A:
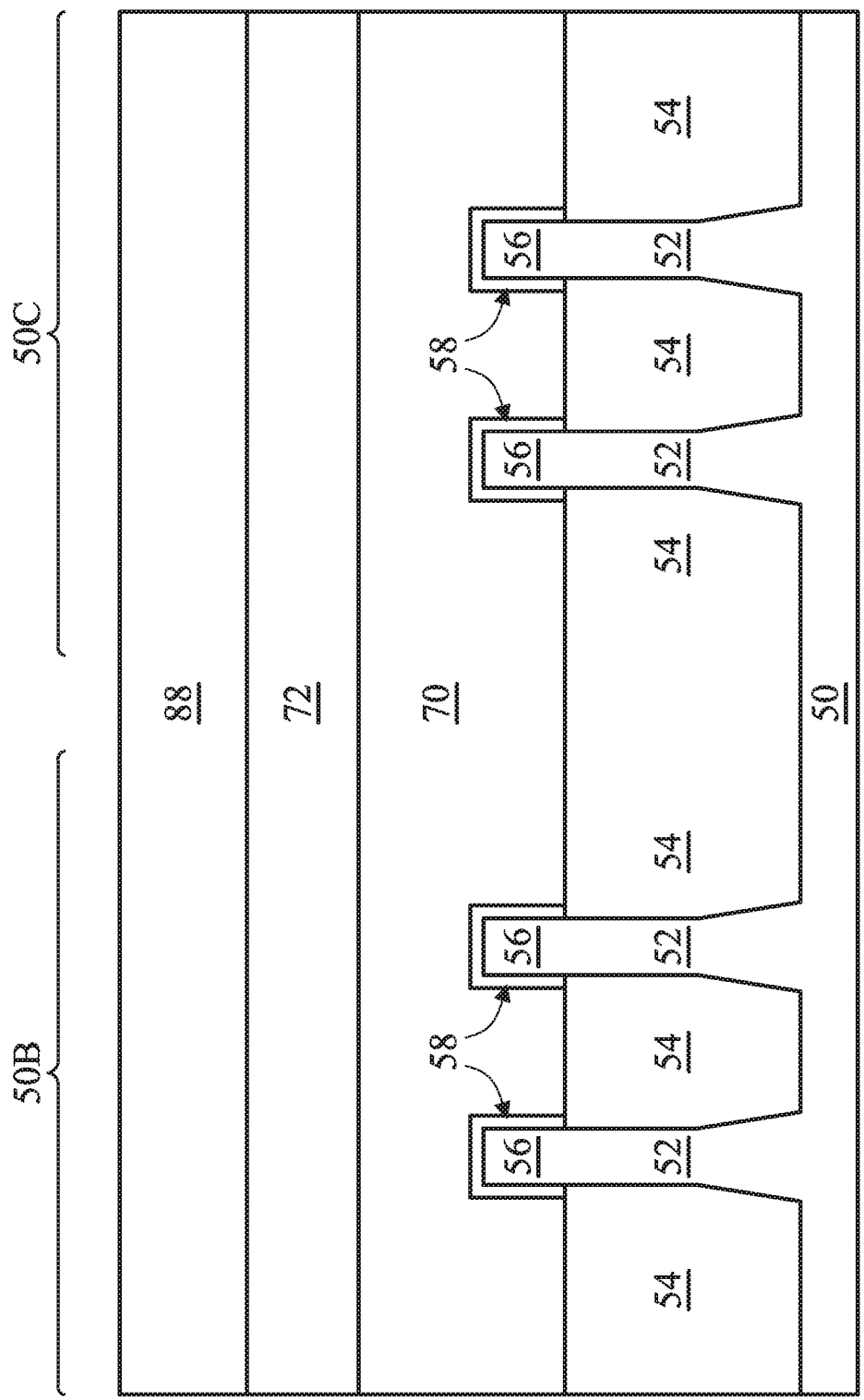
Figure 10B:
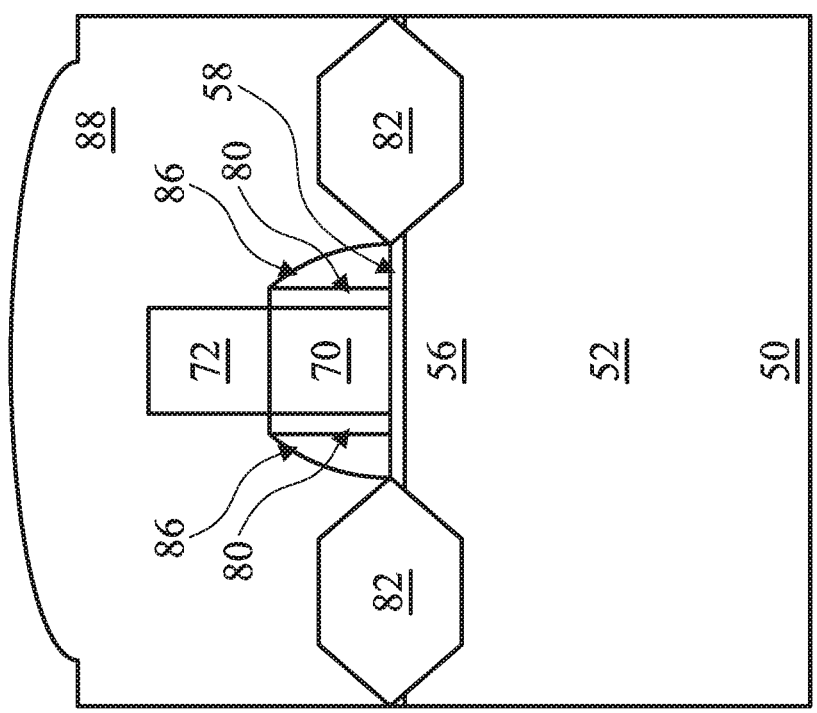

In FIGS. 10A and 10B, an ILD 88 is deposited over the structure illustrated in FIGS. 9A and 9B. The ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), or FCVD. Other insulation materials formed by any acceptable process may be used.

Figure 11A:
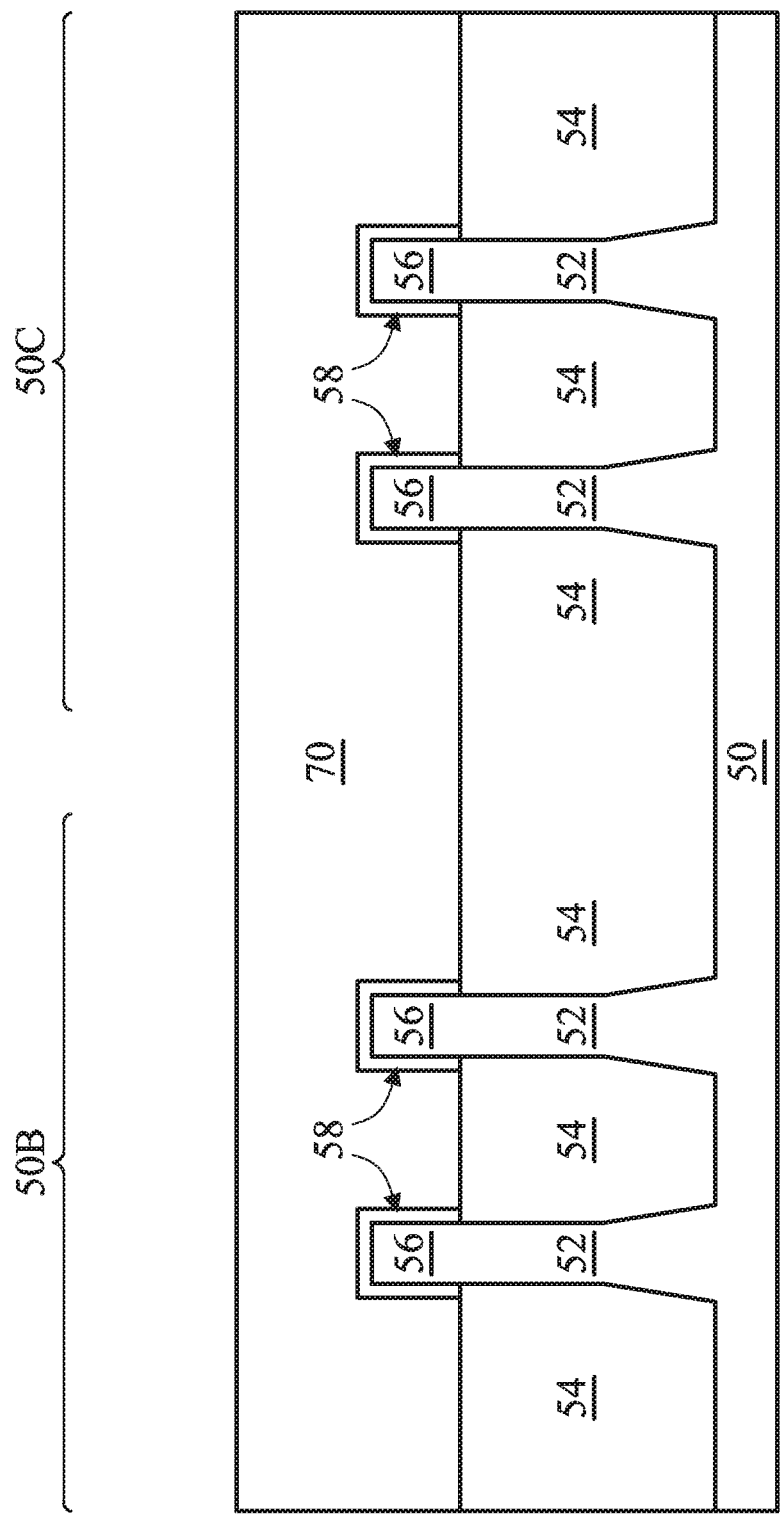
Figure 11B:
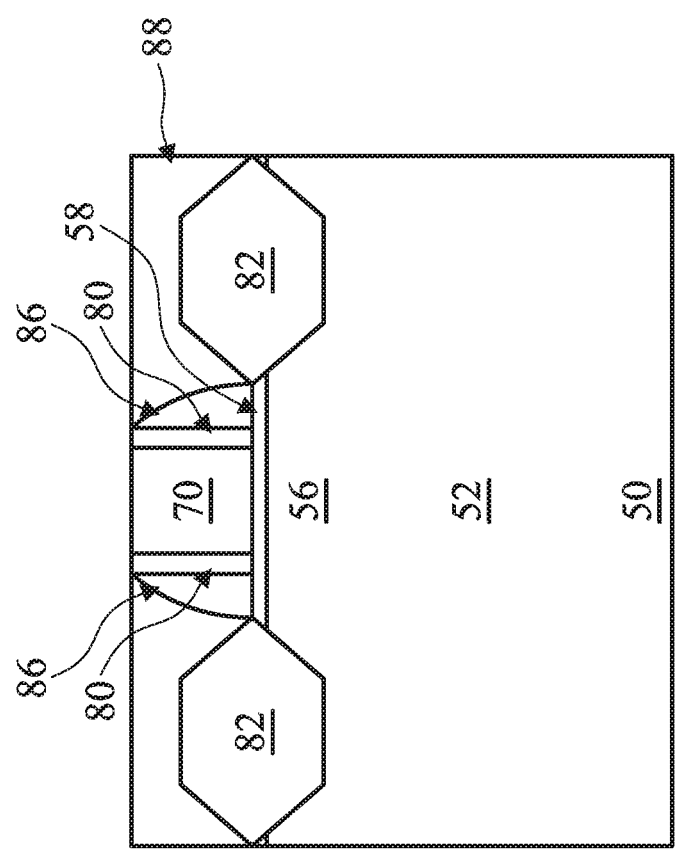
Figure 11C:
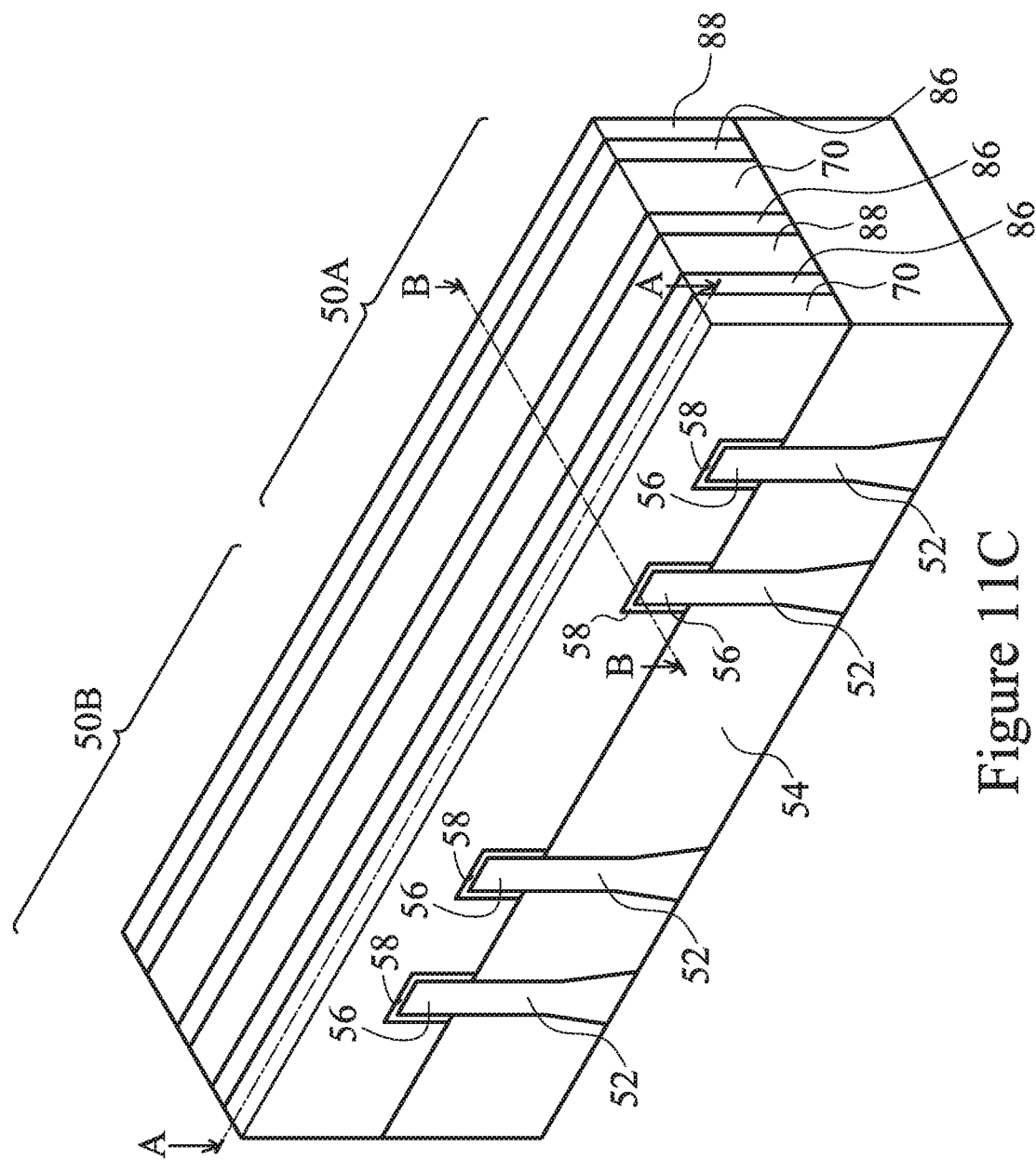

In FIGS. 11A, 11B, and 11C, a planarization process, such as a CMP, may be performed to level the top surface of ILD 88 with the top surfaces of the dummy gates 70. The CMP may also remove the masks 72 on the dummy gates 70. Accordingly, top surfaces of the dummy gates 70 are exposed through the ILD 88.

Figure 12A:
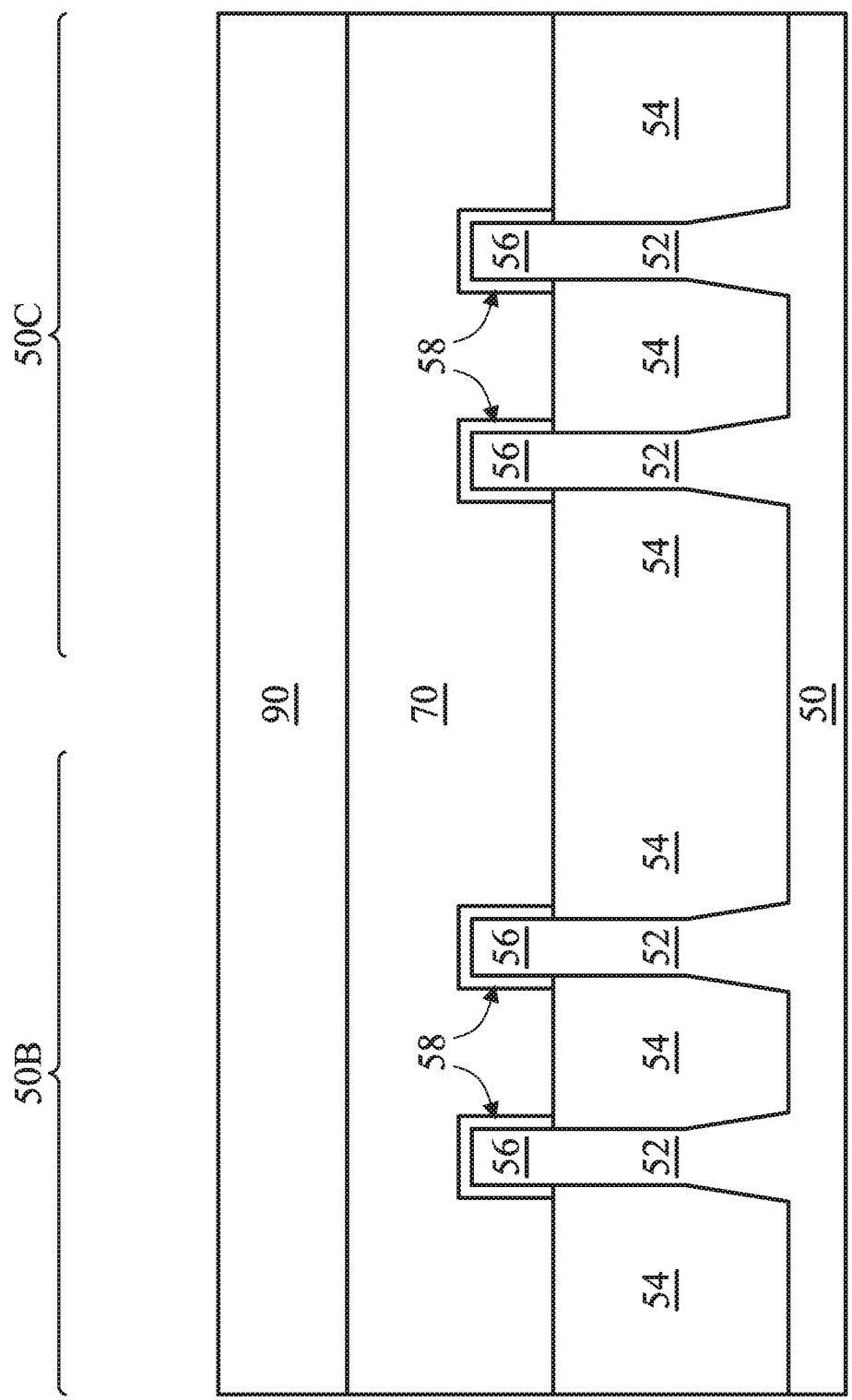
Figure 12B:
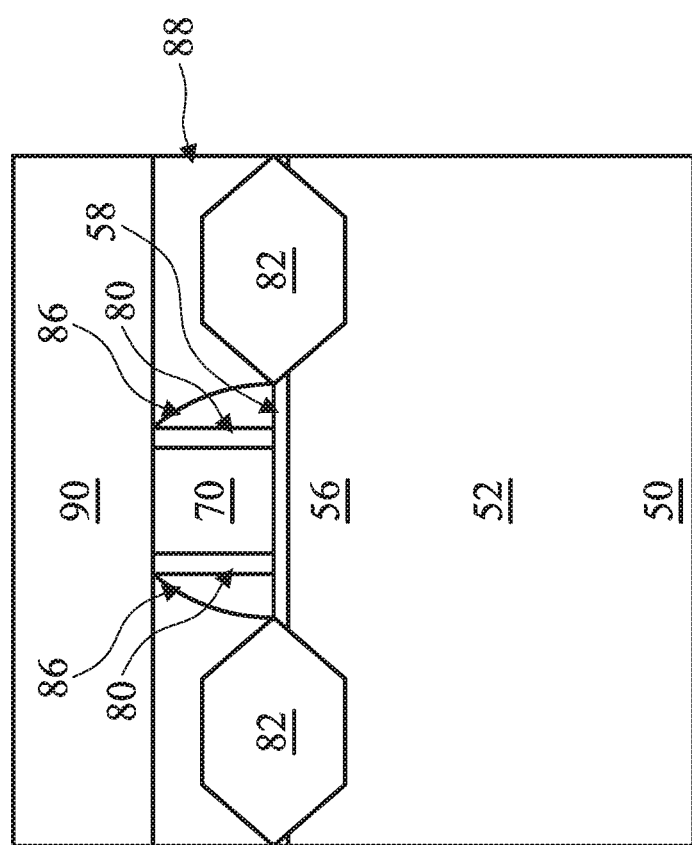
Figure 12C:
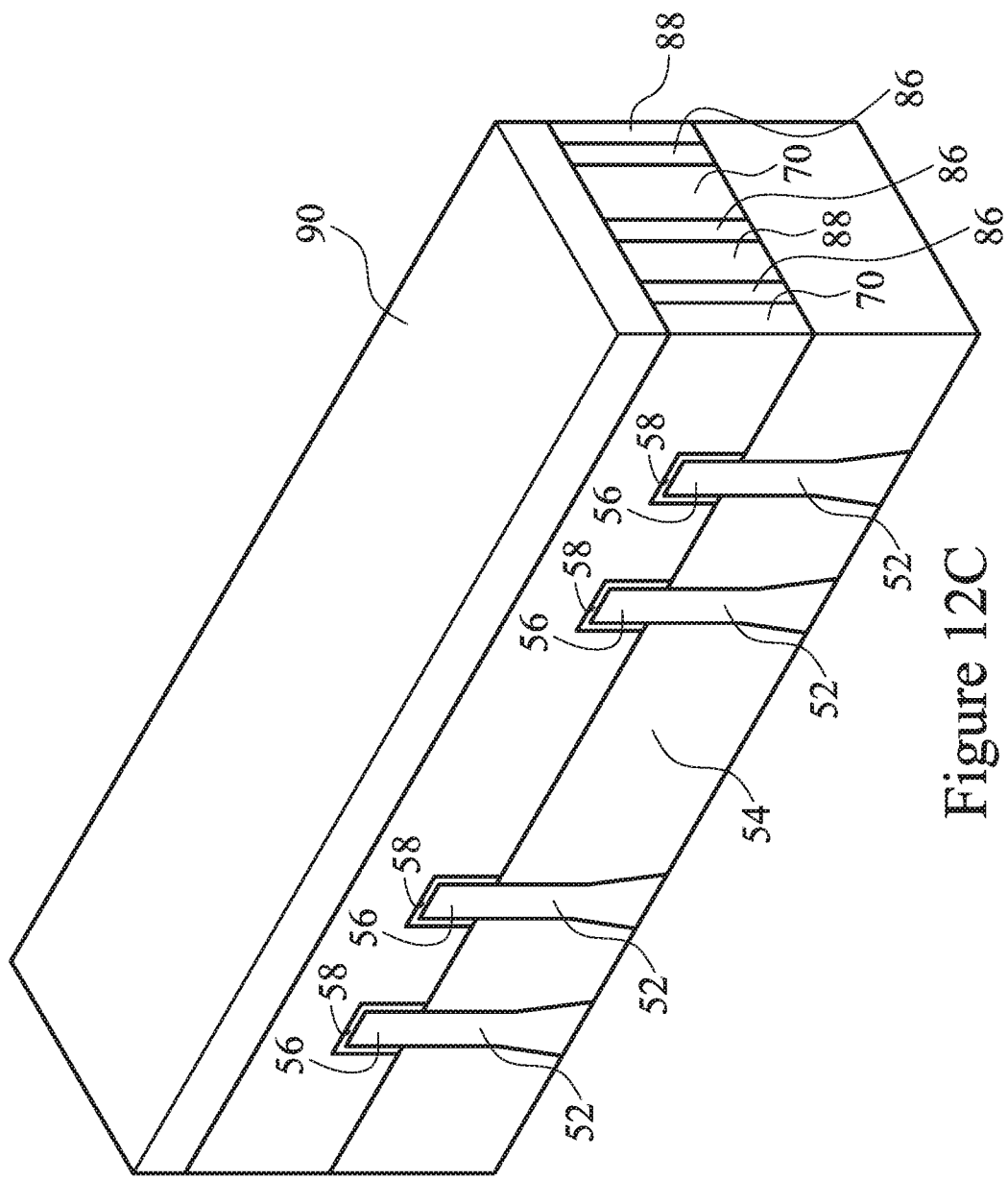

In FIGS. 12A, 12B, and 12C, a hard mask layer 90 is deposited over the structure illustrated in FIGS. 11A, 11B, and 11C. The hard mask layer 90 may be made of SiN, SiON, SiO$_2$, the like, or a combination thereof. The hard mask layer 90 may be formed by CVD, PVD, atomic layer deposition (ALD), a spin-on-dielectric process, the like, or a combination thereof.

Figure 13A:
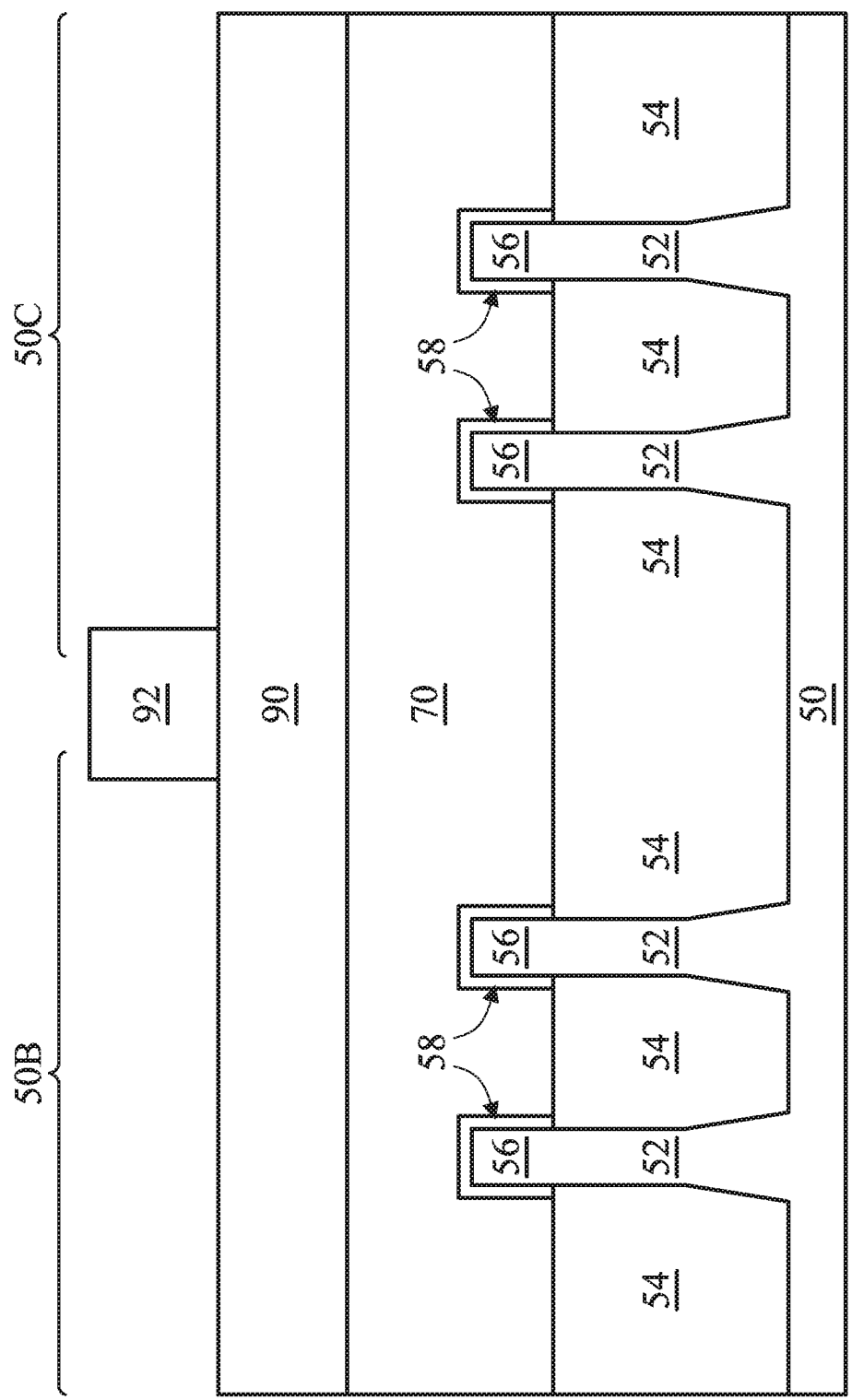
Figure 13B:
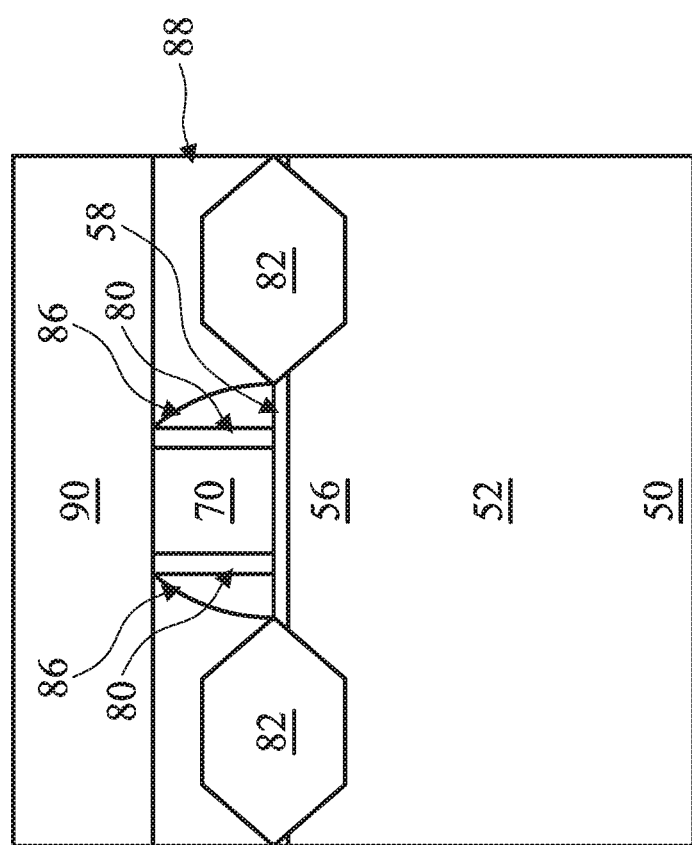
Figure 13C:
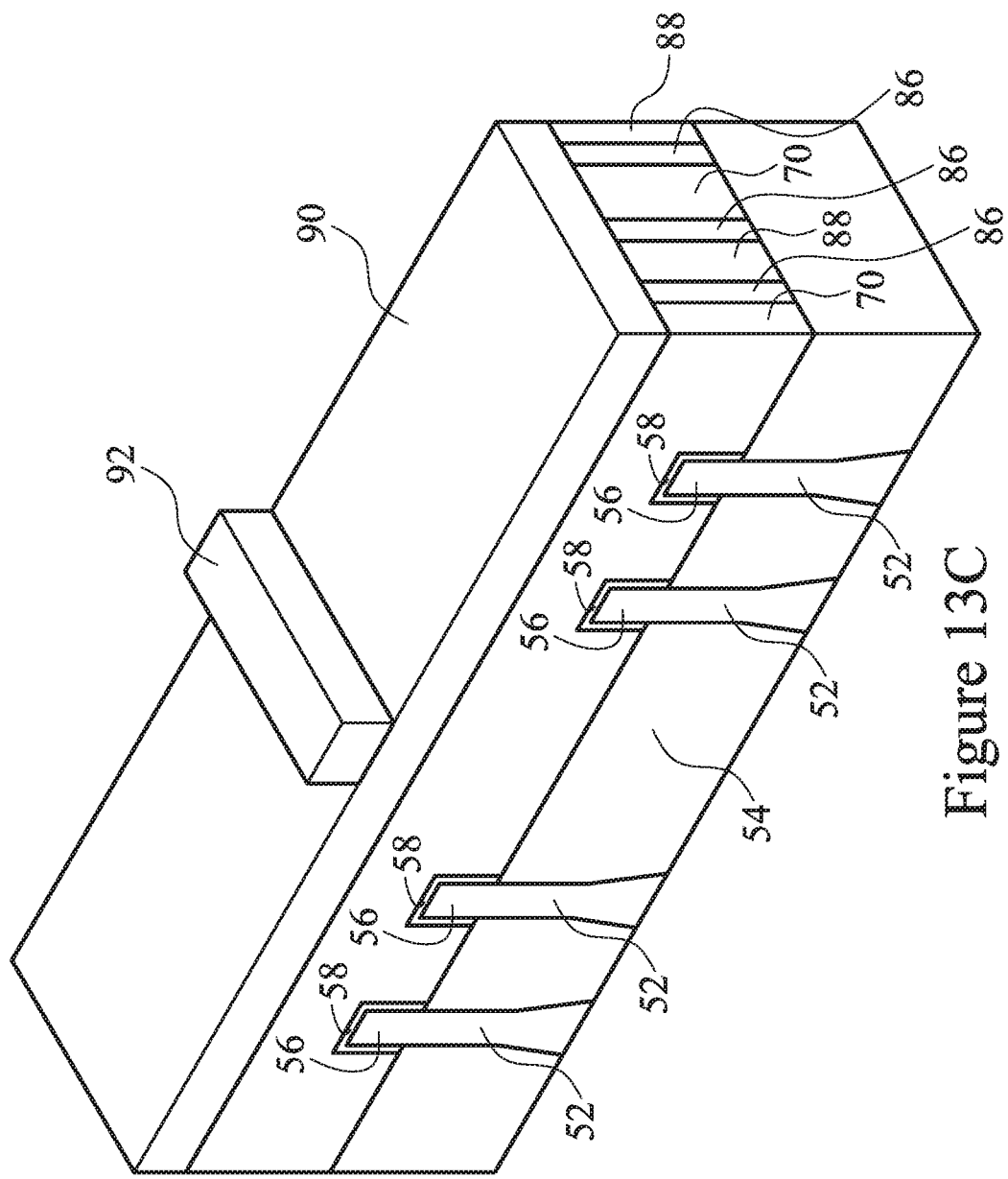

In FIGS. 13A, 13B, and 13C, a photoresist 92 is formed and patterned over the hard mask layer 90. In some embodiments, the photoresist 92 can be formed by using a spin-on technique and can be patterned using acceptable photolithography techniques. After the photoresist 92 is patterned, a trimming process may be performed on the photoresist 92 to reduce the width of the patterned photoresist 92. In an embodiment, the trimming process is an anisotropic plasma etch process with process gases including O$_2$, CO$_2$, N$_2$/H$_2$, H$_2$, the like, a combination thereof, or any other gases suitable for trimming photoresist.

In some embodiments, the photoresist 92 is a tri-layer photoresist. In these embodiments, the tri-layer photoresist 92 includes a top photoresist layer, a middle layer, and a bottom layer. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the hard mask layer 90). The tri-layer photoresist provides a relatively thin top photoresist layer. The middle layer may include anti-reflective materials (e.g., a backside anti-reflective coating (BARC) layer) to aid the exposure and focus of the top photoresist layer's processing. By having the middle layer, the thin top photoresist layer is only used to pattern the middle layer. The bottom layer may include a hard mask material such as a carbon-containing material that is easily removed by O$_2$ or a N$_2$/H$_2$ plasma. The middle layer is used to pattern the bottom layer. In some embodiments, the middle layer has a high etch selectivity to the bottom layer, and, in some embodiments, the bottom layer is more than ten times thicker than the middle layer. Thus, the tri-layer photoresist 92 allows for the robust patterning of underlying layers (e.g., the hard mask layer 90) while still providing a relatively thin top photoresist layer.

The top photoresist layer of the tri-layer photoresist 92 may be patterned using any suitable photolithography technique. For example, a photomask (not shown) may be disposed over the top photoresist layer, which may then be exposed to a radiation beam including an ultraviolet (UV) or an excimer laser such as a 248 nm beam from a Krypton Fluoride (KrF) excimer laser, or a 193 nm beam from an Argon Fluoride (ArF) excimer laser. Exposure of the top photoresist layer may be performed using an immersion lithography system to increase resolution and decrease the minimum achievable pitch. A bake or cure operation may be performed to harden the top photoresist layer, and a developer may be used to remove either the exposed or unexposed portions of the top photoresist layer depending on whether a positive or negative resist is used. After the patterning of the top photoresist layer of the tri-layer photoresist 92, a trimming process may be performed to reduce the width of the top photoresist layer of the tri-layer photoresist 92. In an embodiment, the trimming process is an anisotropic plasma etch process with process gases including O$_2$, CO$_2$, N$_2$/H$_2$, H$_2$, the like, a combination thereof, or any other gases suitable for trimming photoresist. After the trimming process, the middle and bottom layers may be patterned leaving the patterned tri-layer photoresist 92 illustrated in FIGS. 13A and 13C.

Figure 14A:
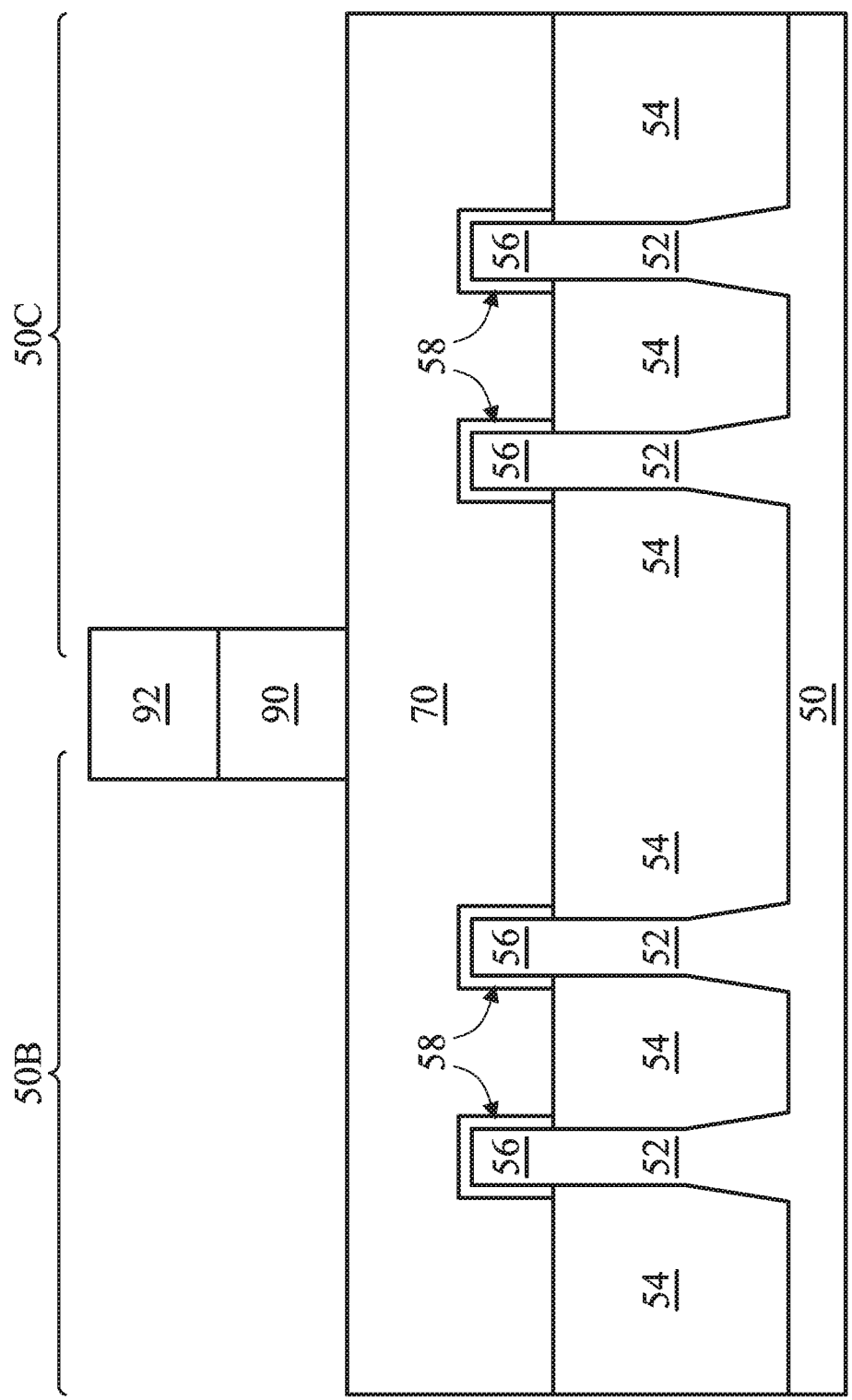
Figure 14B:
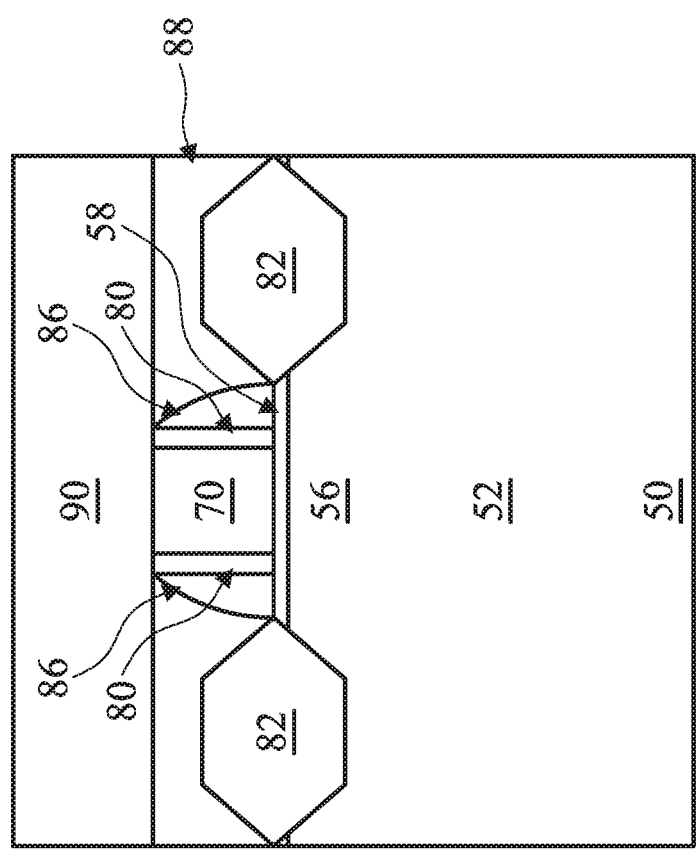
Figure 14C:
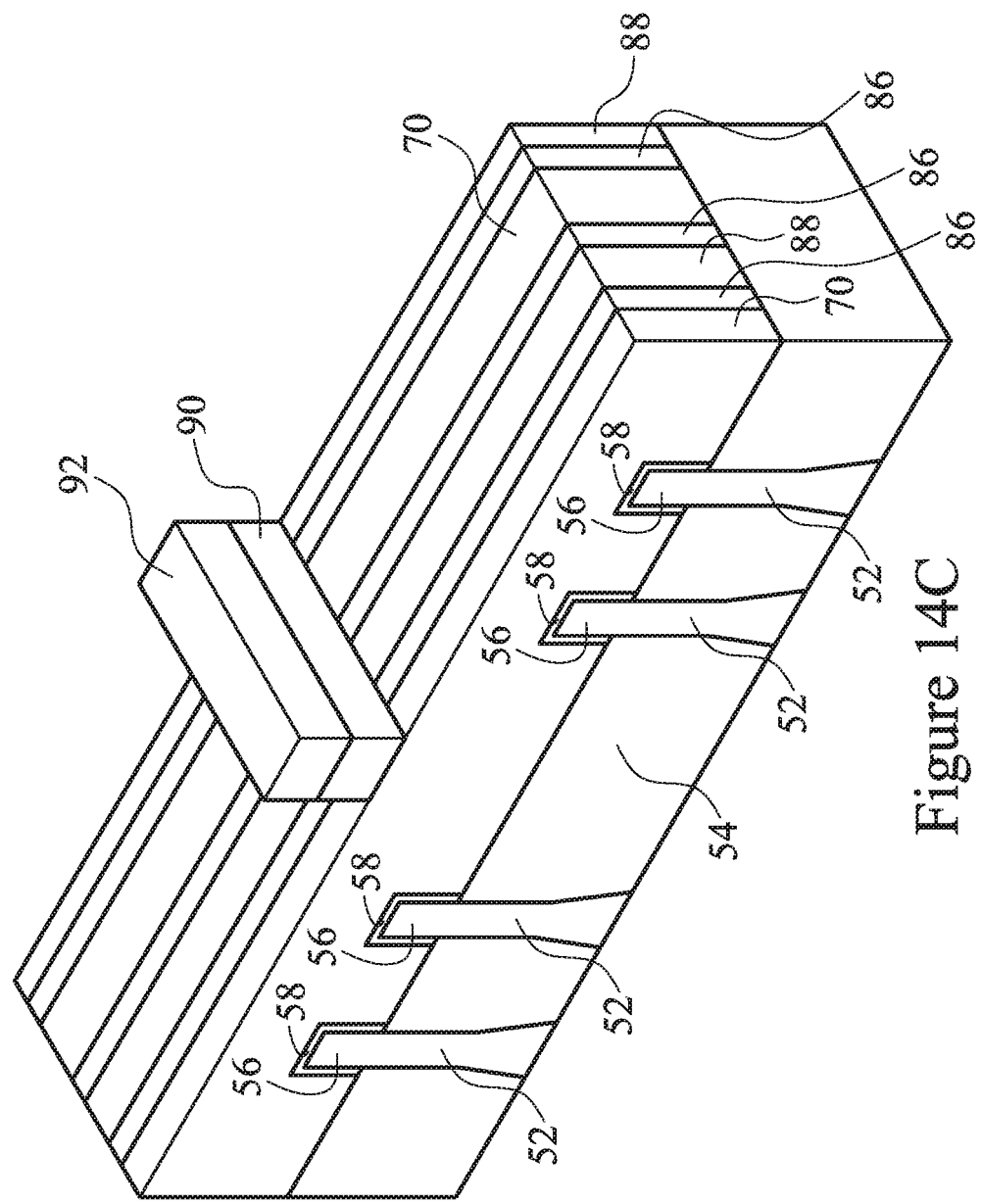

In FIGS. 14A, 14B, and 14C, the hard mask layer 90 is patterned using the photoresist 92 as a mask. The patterning of the hard mask layer 90 may be performed using any acceptable etching process, such as an anisotropic dry etch process. After the patterning of the hard mask layer 90, top surfaces of the dummy gates 70, gate spacers 86, and ILDs 88 are exposed.

Figure 15A:
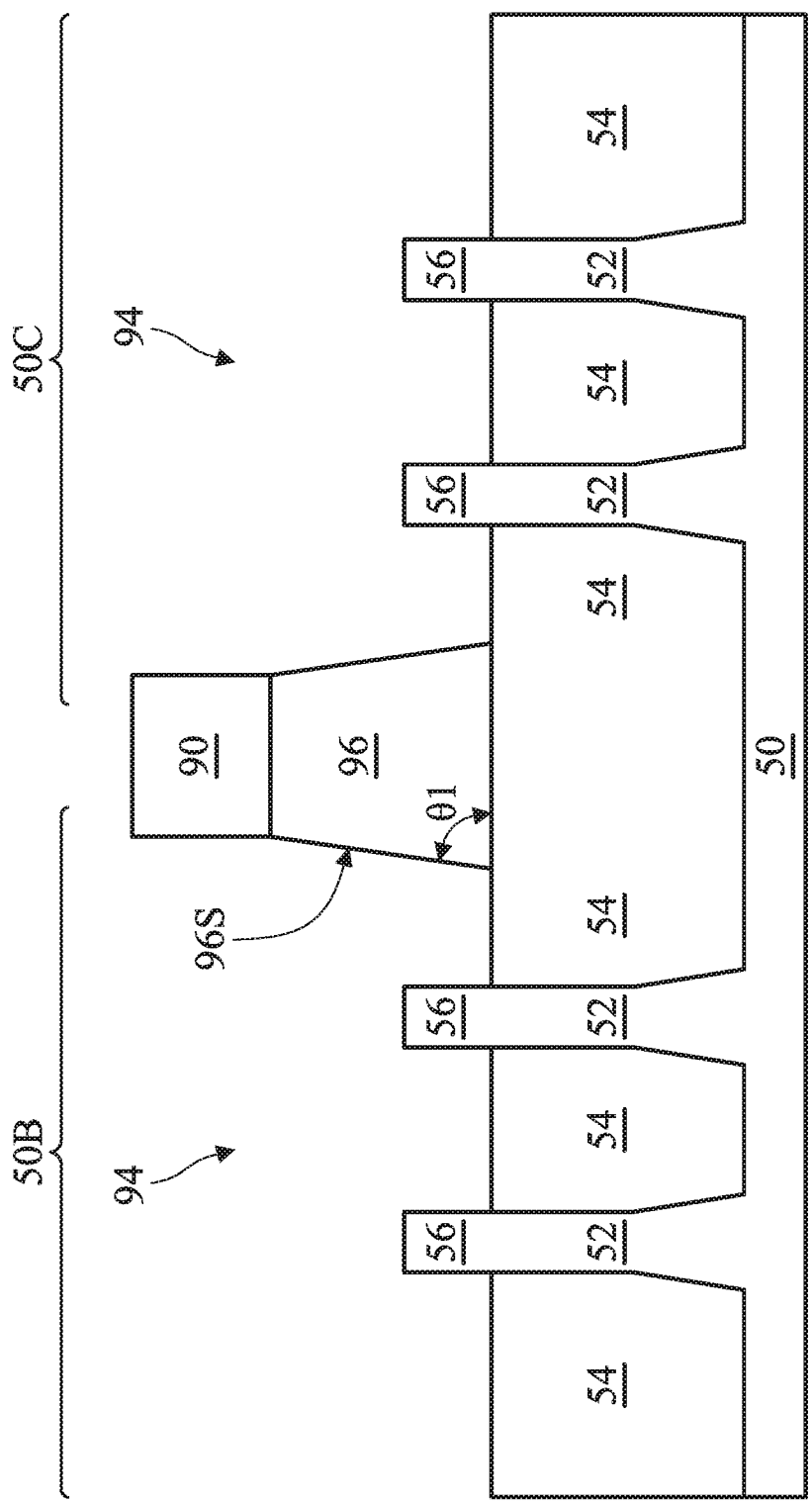
Figure 15B:
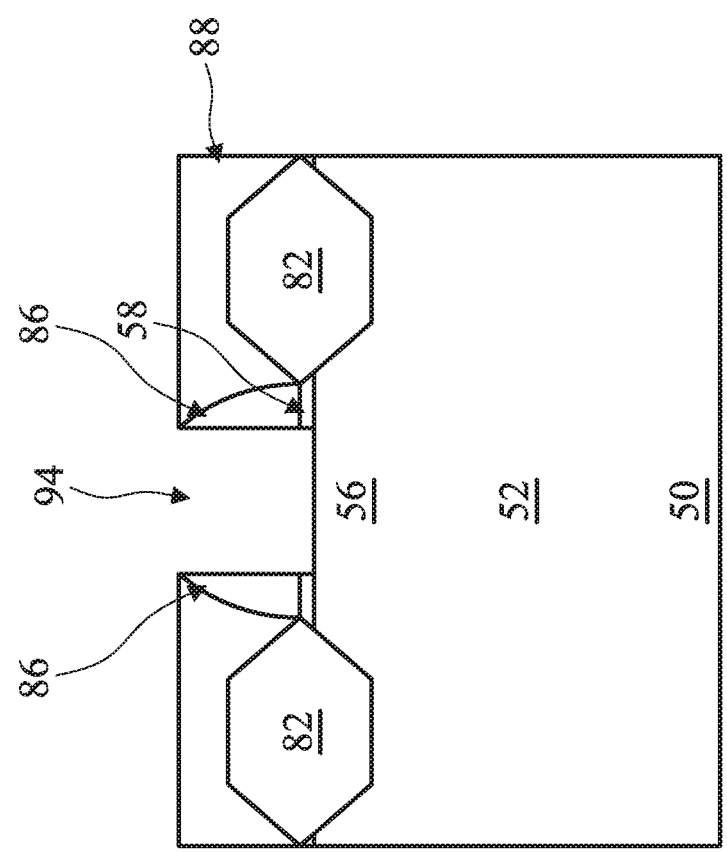
Figure 15C:
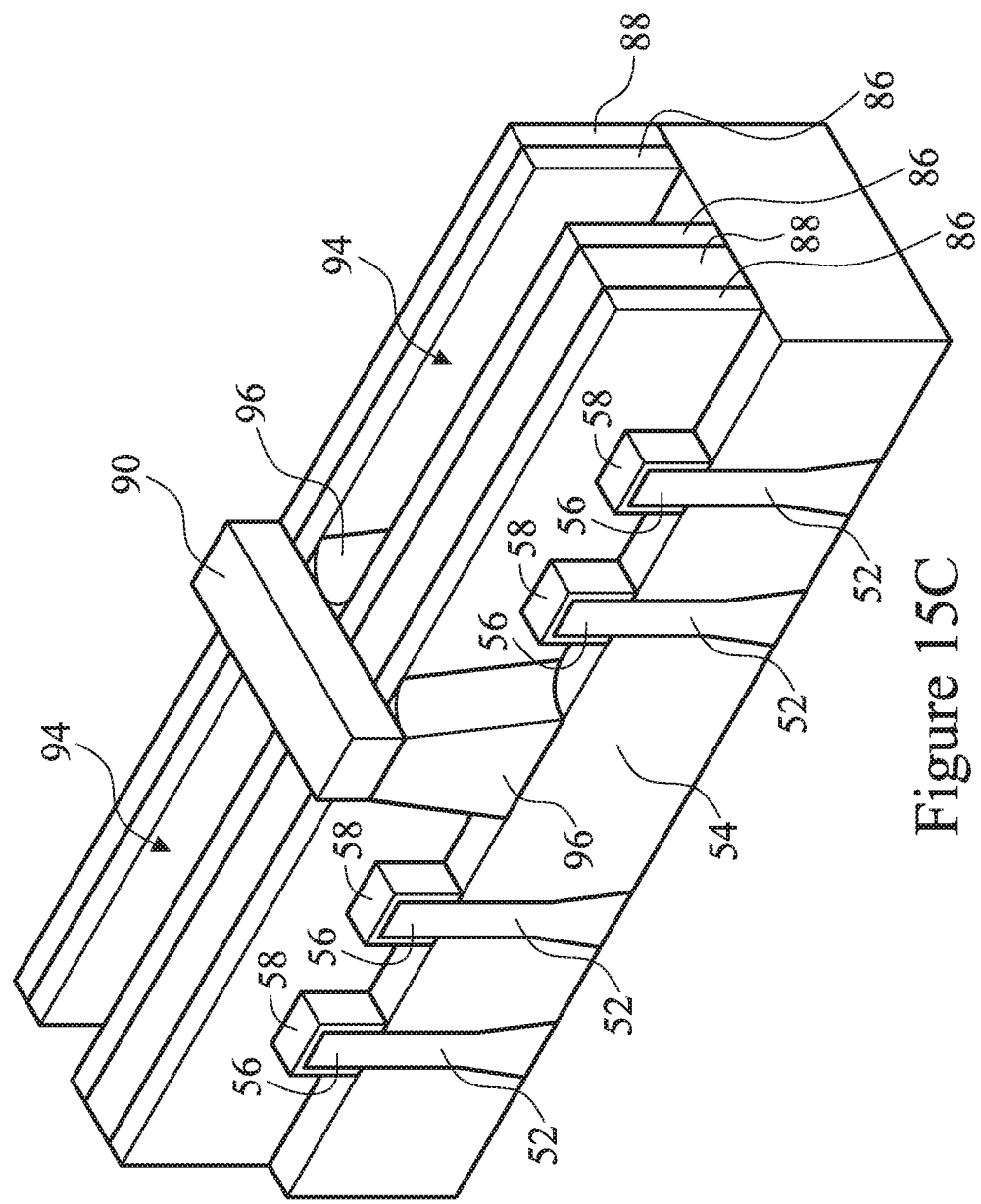

In FIGS. 15A, 15B, and 15C, the exposed portions of the dummy gates 70, gate seal spacers 80, and portions of the dummy dielectric layer 58 directly underlying the exposed dummy gates 70 are removed in an etching step(s), so that recesses 94 are formed and portions 96 of the dummy gates 70 remain under the patterned hard mask 90. In some embodiments, the dummy gates 70 are removed by an anisotropic dry etch process. For example, the etching process may include a dry etch process using reaction gas(es) that selectively etches the dummy gates 70 without etching the hard mask layer 90, the ILD 88, and the gate spacers 86. Each recess 94 exposes a channel region of a respective fin. Each channel region is disposed between neighboring pairs of epitaxial source/drain regions 82. During the removal, the dummy dielectric layer 58 may be used as an etch stop layer when the dummy gates 70 are etched. The dummy dielectric layer 58 and gate seal spacers 80 may then be removed after the removal of the dummy gates 70.

The recesses 94 are defined by the exposed surfaces of the fins 56, the isolation regions 54, the sidewalls 96S of the remaining portions 96 of dummy gates, and inner surfaces of the gate spacers 86. In some embodiments, the sidewalls 96S of portion 96 of the remaining dummy gate 70 (referred to as remaining portion 96 hereinafter) are slanted relative to a major surface of the substrate 50. In other words, the sidewalls 96S of the remaining portion 96 are not parallel and not perpendicular to the major surface of the substrate 50. In some embodiments, the sidewalls 96S of the remaining portions 96 form an angle θ1 with a plane parallel to the major surface of the substrate 50. In an embodiment, the angle θ1 is less than about 90°, such as is in a range from about 75° to about 89°. Further, as measured in a direction perpendicular to longitudinal axes of the fins 56, the remaining portions 96 are wider at their interfaces with the isolation regions 54 (i.e. bottom surfaces of remaining portions 96) than at their top surfaces, such that the remaining portions taper from the bottom towards the top. This tapering is caused by the etch process that forms the remaining portions 96 as the etch does not create perfectly vertical sidewalls 96S of the remaining portions 96.

Figure 16A:
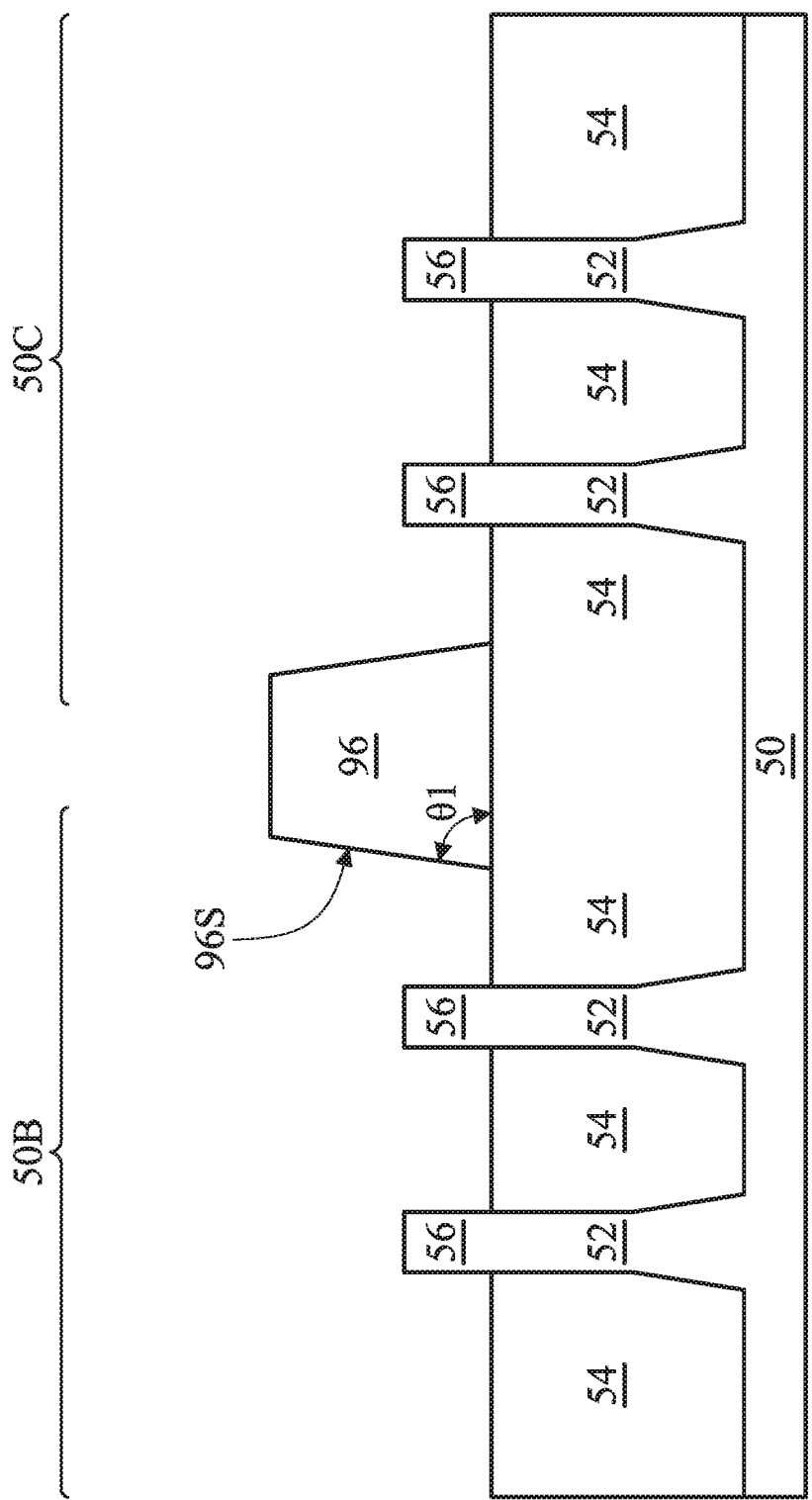
Figure 16B:
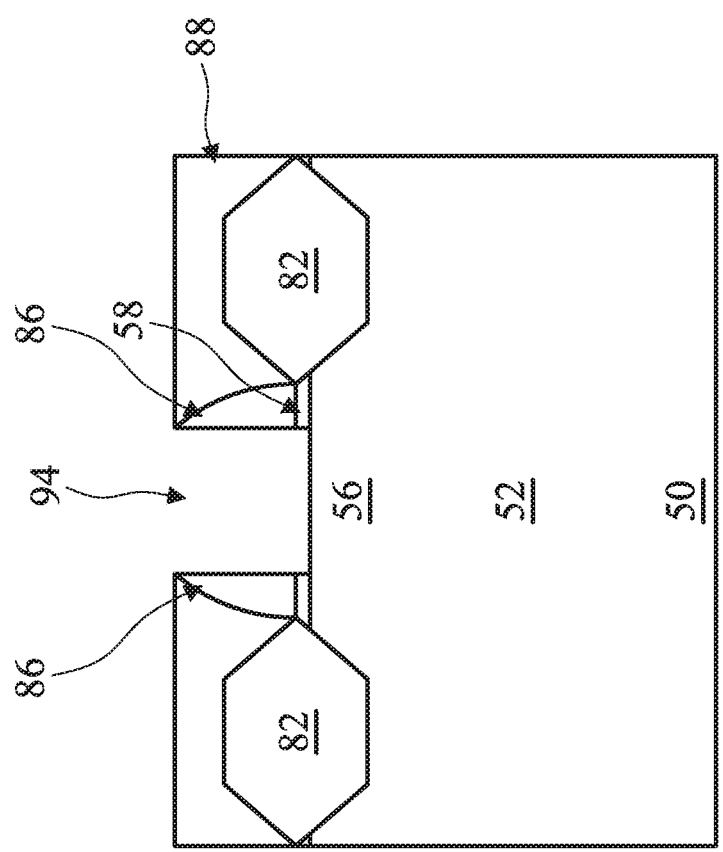
Figure 16C:
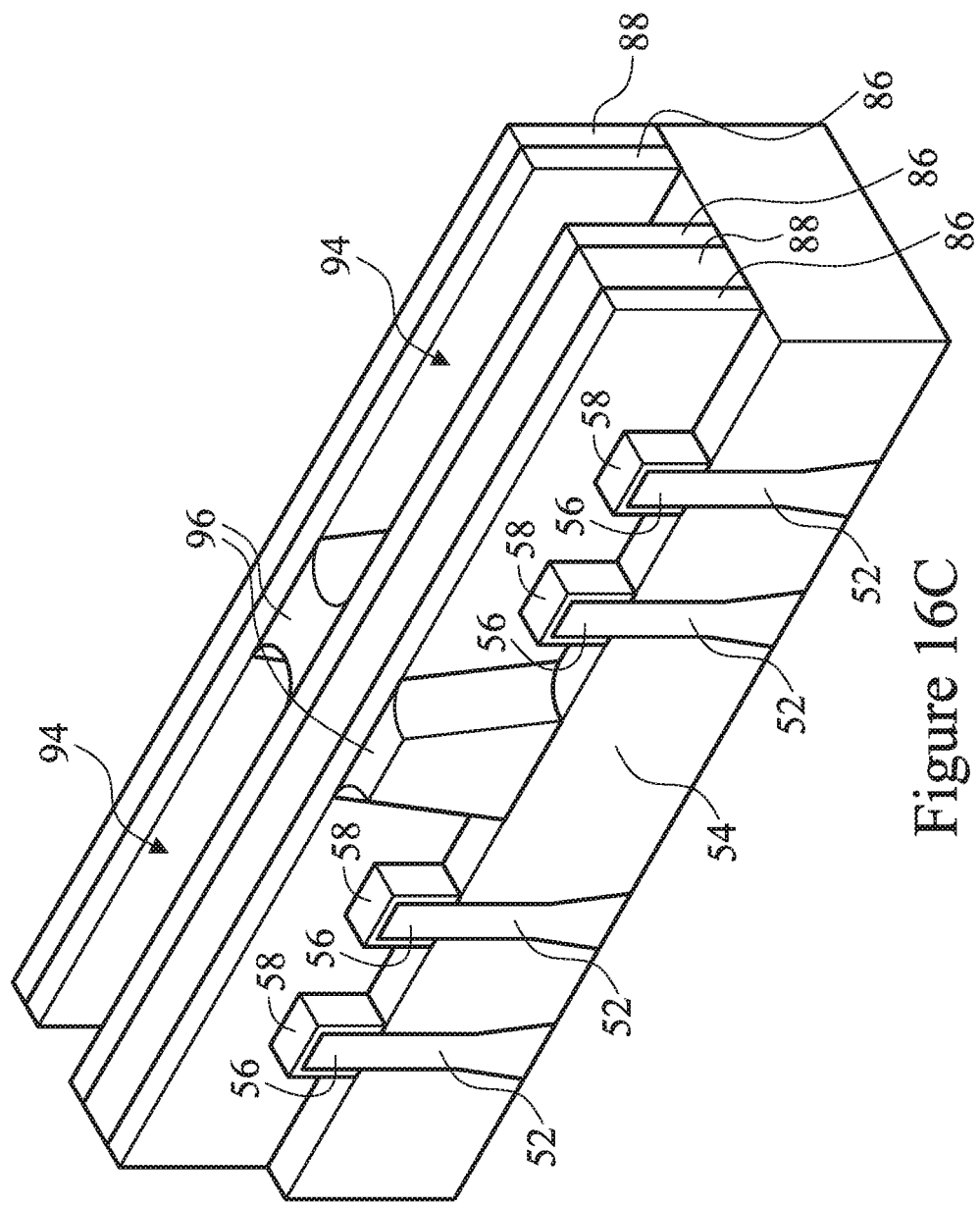
Figure 17A:
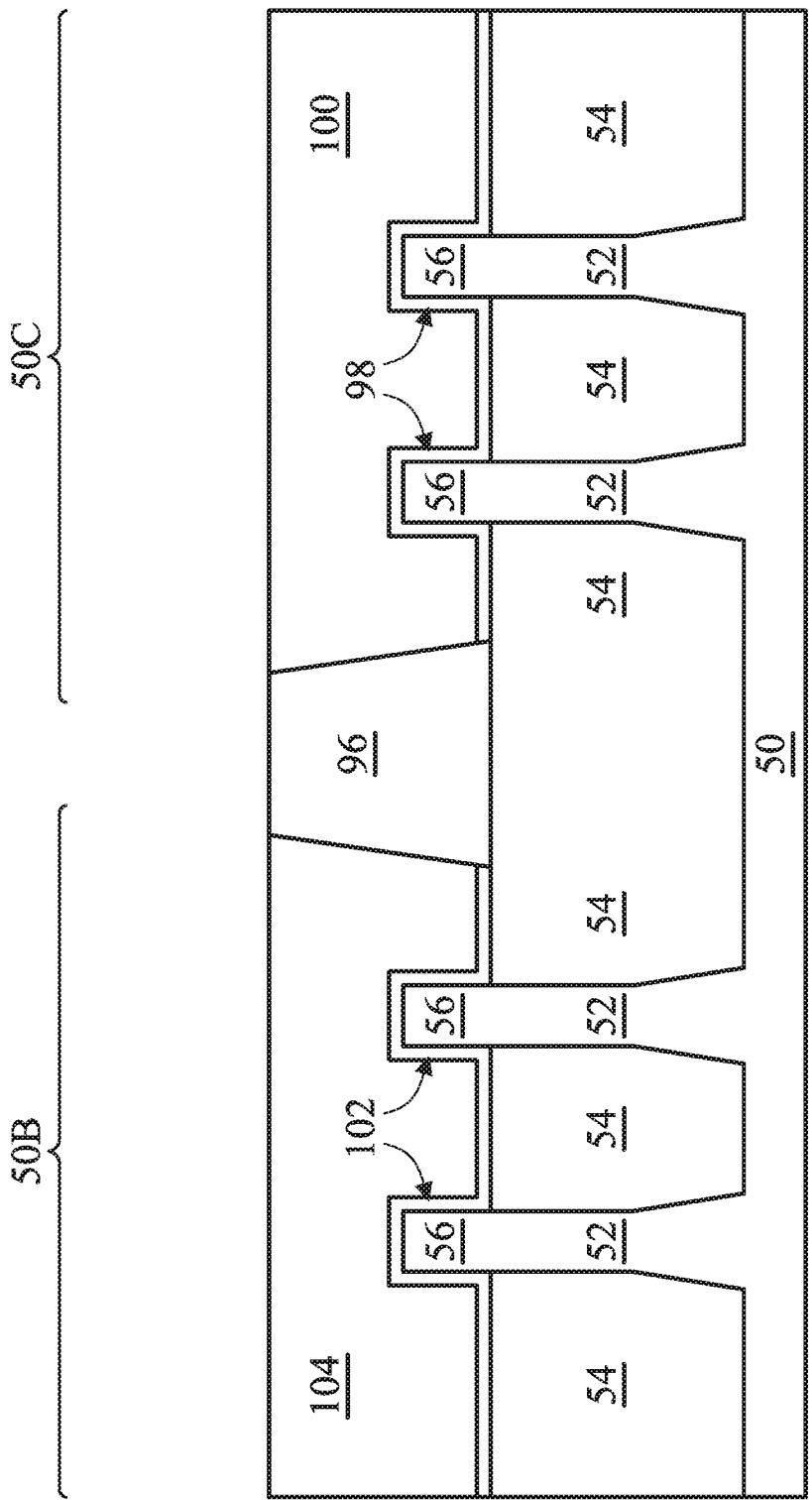
Figure 17B:
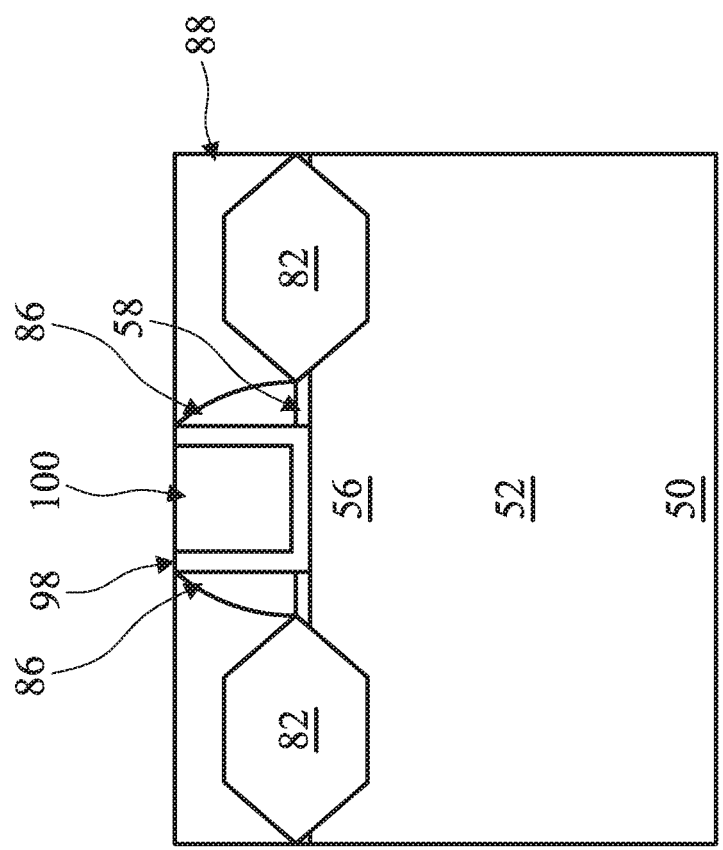
Figure 17C:
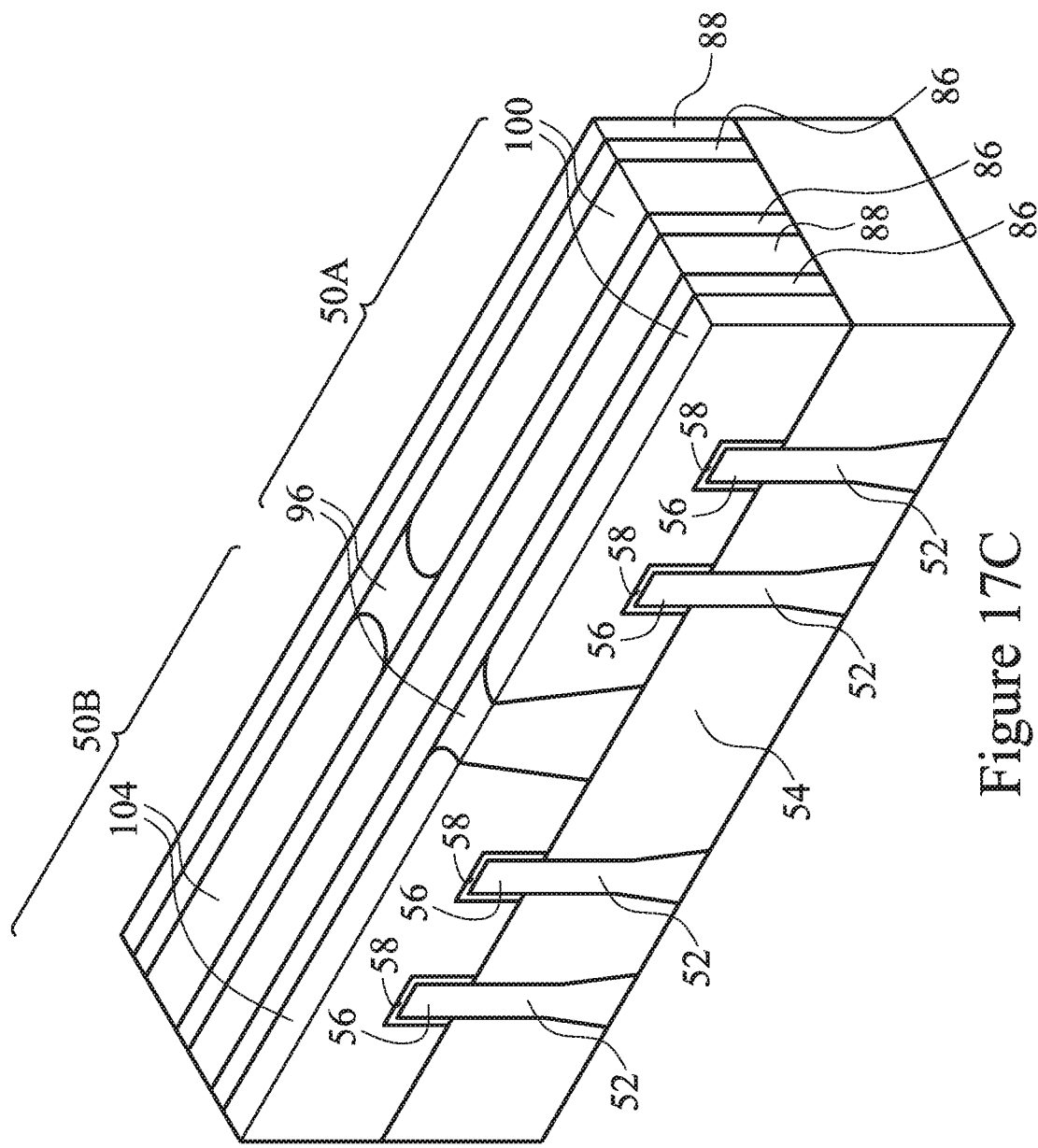

In FIGS. 16A, 16B, and 16C, the patterned hard mask layer 90 is removed to expose a top surface of the remaining portion 96. The patterned hard mask layer 90 may be removed by using an acceptable etching process, such as one that is selective to the material of the patterned hard mask layer 90. In some embodiments, the patterned hard mask layer 90 may be removed by a planarization process, such as a CMP process. As illustrated in FIG. 16C, the sidewalls 96S of the remaining portions 96 are not planar, but rather are concave in a top-view with the remaining portions 96 being wider in the top-view nearer the gate spacers 86. In some embodiments, the dummy dielectric layers 58 are not removed when the patterned hard mask 90 is present but are removed after it is removed with, for example, a selective etch process, such as a wet etch process.

In FIGS. 17A, 17B, and 17C 5, gate dielectric layers 98 and 102 and gate electrodes 100 and 104 are formed for replacement gates. Gate dielectric layers 98 and 102 are deposited conformally in recesses 94, such as on the top surfaces and the sidewalls of the fins 56 and on sidewalls of the gate spacers 86, and on a top surface of the ILD 88. In accordance with some embodiments, gate dielectric layers 98 and 102 comprise silicon oxide, silicon nitride, or multilayers thereof. In other embodiments, gate dielectric layers 98 and 102 comprise a high-k dielectric material, and in these embodiments, gate dielectric layers 98 and 102 may have a k value greater than about 7.0, and may include a metal oxide or a silicate of Hf, Al, Zr, La, Mg, Ba, Ti, Pb, and combinations thereof. The formation methods of gate dielectric layers 98 and 102 may include Molecular-Beam Deposition (MBD), ALD, PECVD, and the like.

Next, gate electrodes 100 and 104 are deposited over gate dielectric layers 98 and 102, respectively, and fill the remaining portions of the recesses 94. Gate electrodes 100 and 104 may comprise a metal-containing material such as TiN, TaN, TaC, Co, Ru, Al, combinations thereof, or multi-layers thereof. After the filling of gate electrodes 100 and 104, a planarization process, such as a CMP, may be performed to remove the excess portions of gate dielectric layers 98 and 102 and the material of gate electrodes 100 and 104, which excess portions are over the top surface of ILD 88 and the remaining portion 96. The resulting remaining portions of material of gate electrodes 100 and 104 and gate dielectric layers 98 and 102 thus form replacement gates of the resulting FinFETs.

The formation of the gate dielectric layers 98 and 102 may occur simultaneously such that the gate dielectric layers 98 and 102 comprise the same materials, and the formation of the gate electrodes 100 and 104 may occur simultaneously such that the gate electrodes 100 and 104 comprise the same materials. However, in other embodiments, the gate dielectric layers 98 and 102 may be formed by distinct processes, such that the gate dielectric layers 98 and 102 may comprise different materials, and the gate electrodes 100 and 104 may be formed by distinct processes, such that the gate electrodes 100 and 104 may comprise different materials. Various masking steps may be used to mask and expose appropriate regions when using distinct processes.

After the formation of the replacement gates, the remaining portion 96 separates the replacement gates having in the first region 50B from the replacement gates in the second region 50C that have the same longitudinal axis. In subsequent processing, this remaining portion 96 will be replaced with an insulating material (see FIGS. 19A, 19B, and 19C) to provide isolation between the replacement gates in the first region 50B and the replacement gates in the second region 50C.

Figure 18A:
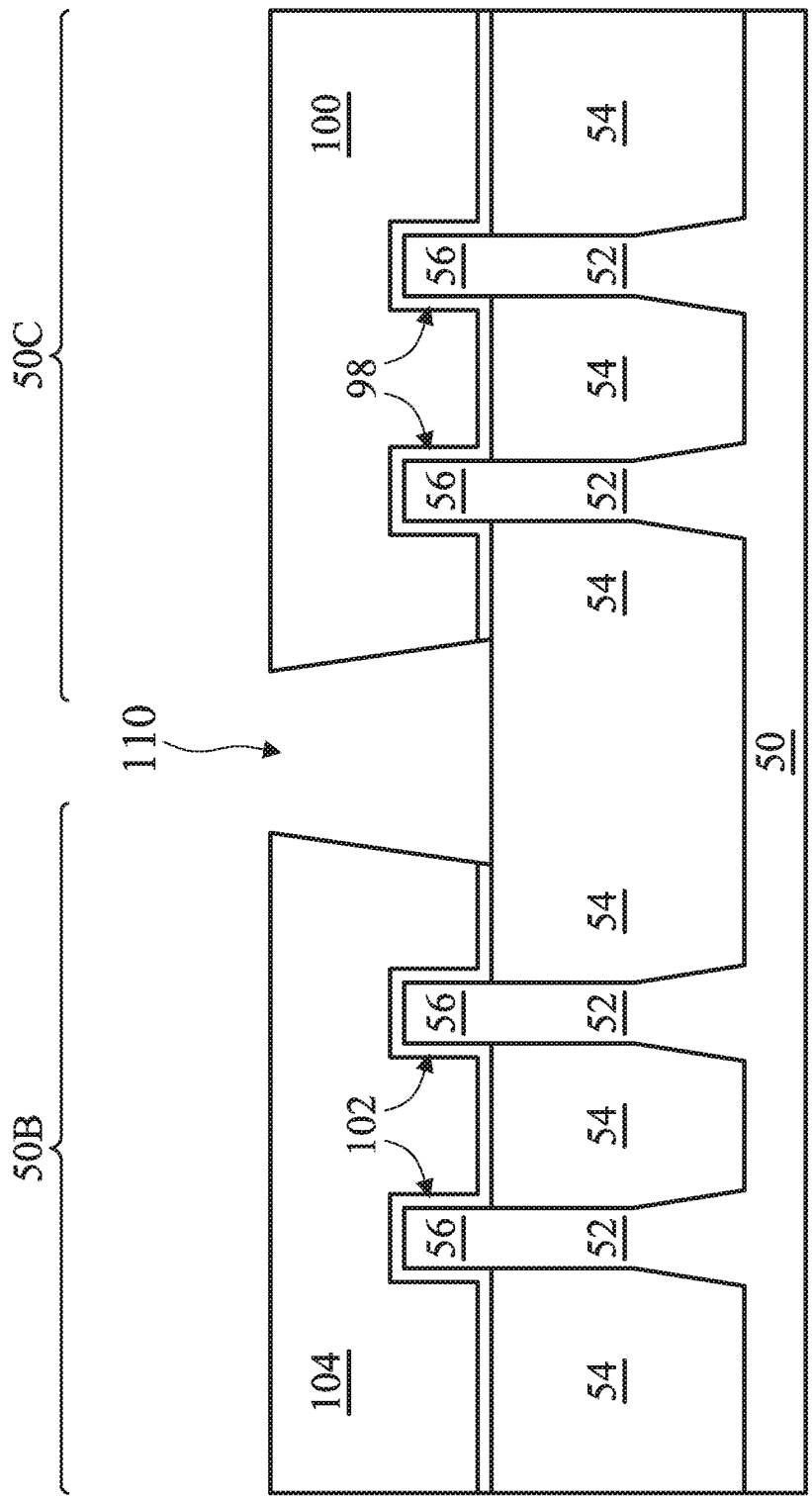
Figure 18B:
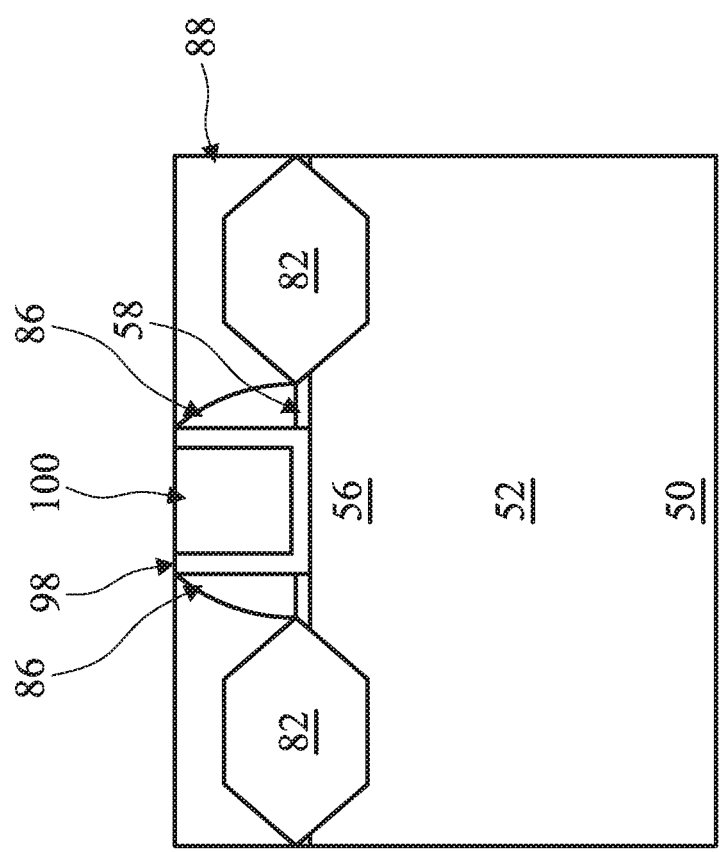
Figure 18C:
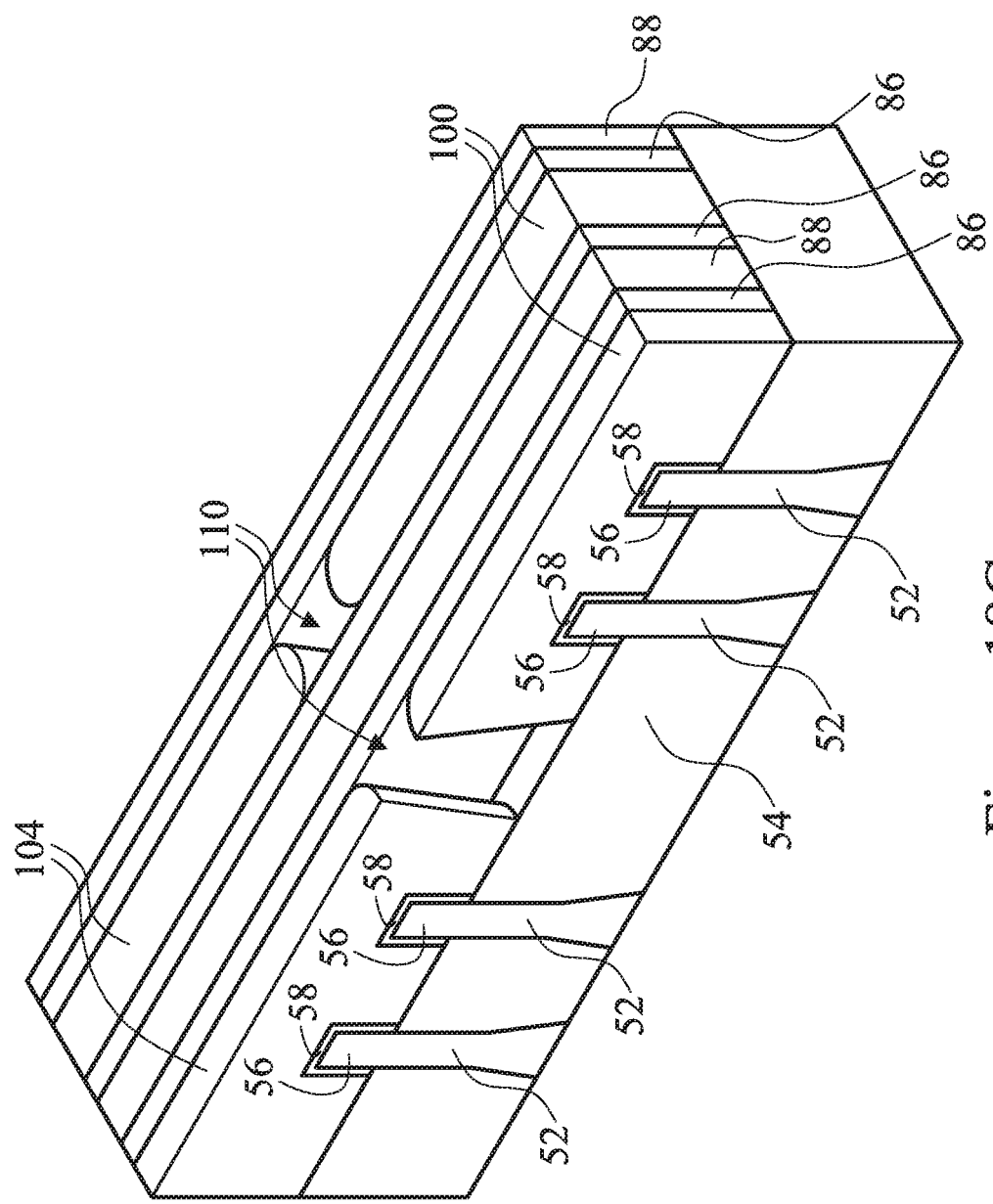
Figure 19A:
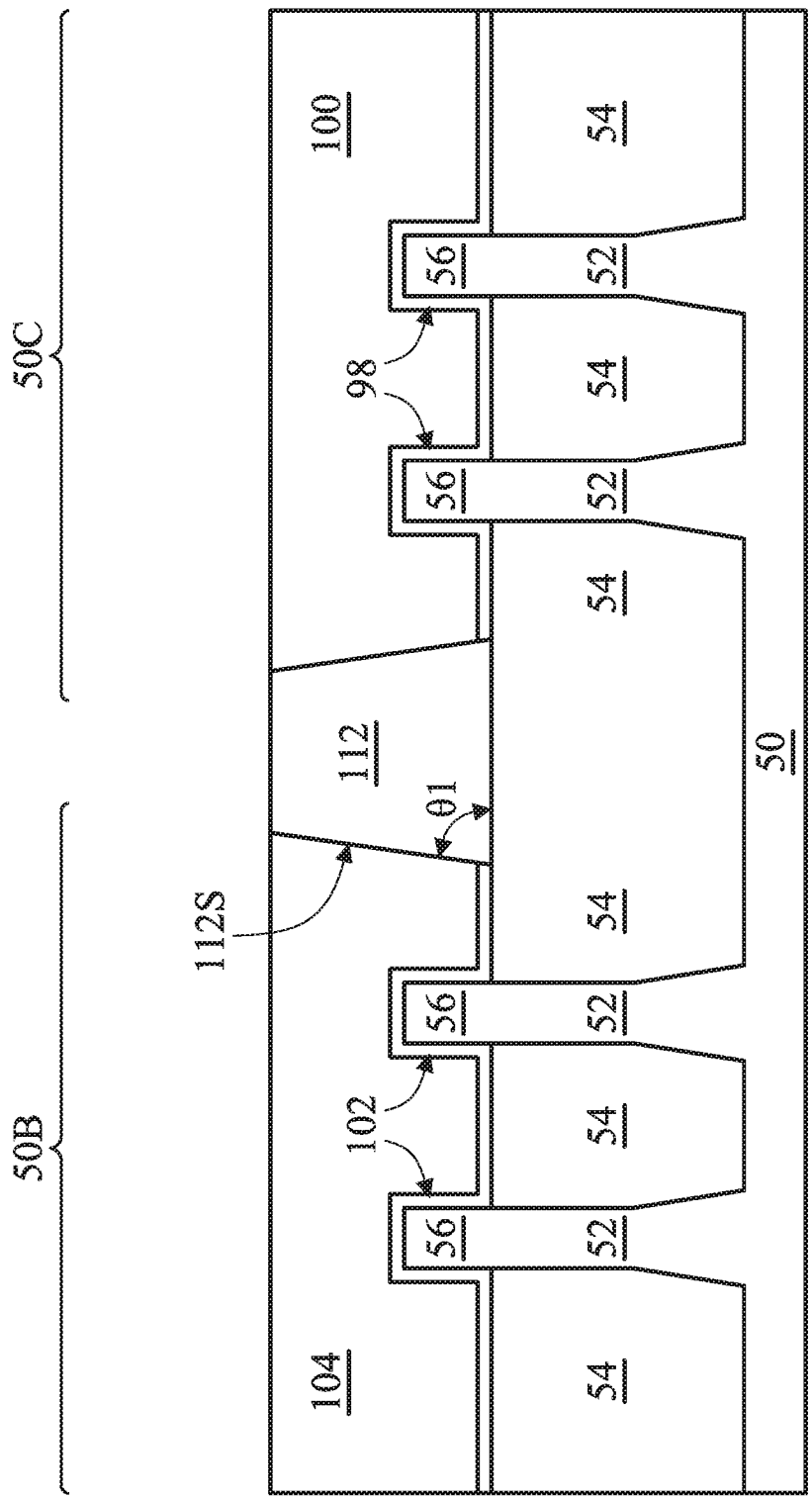
Figure 19B:
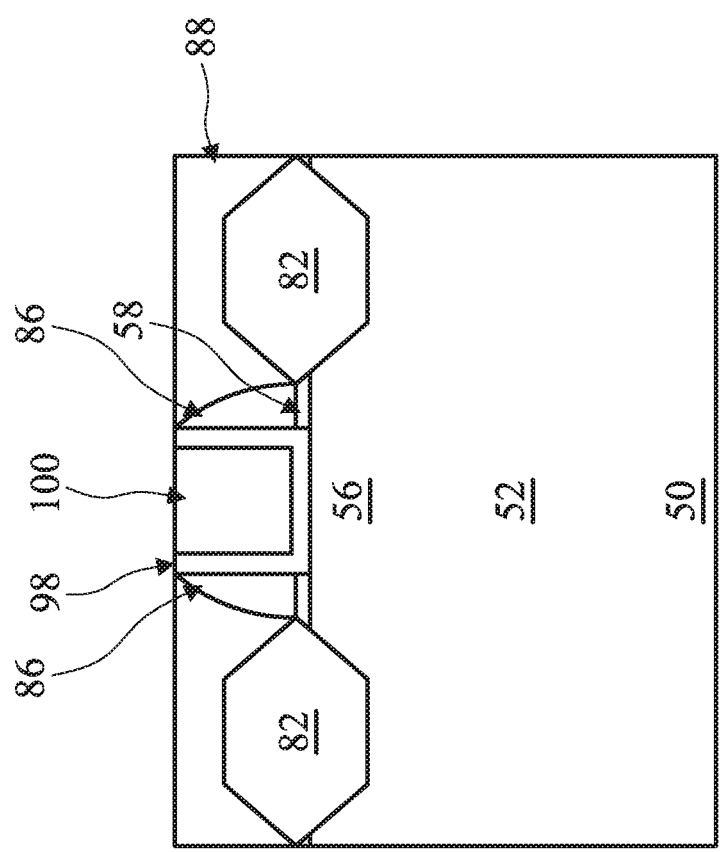
Figure 19C:
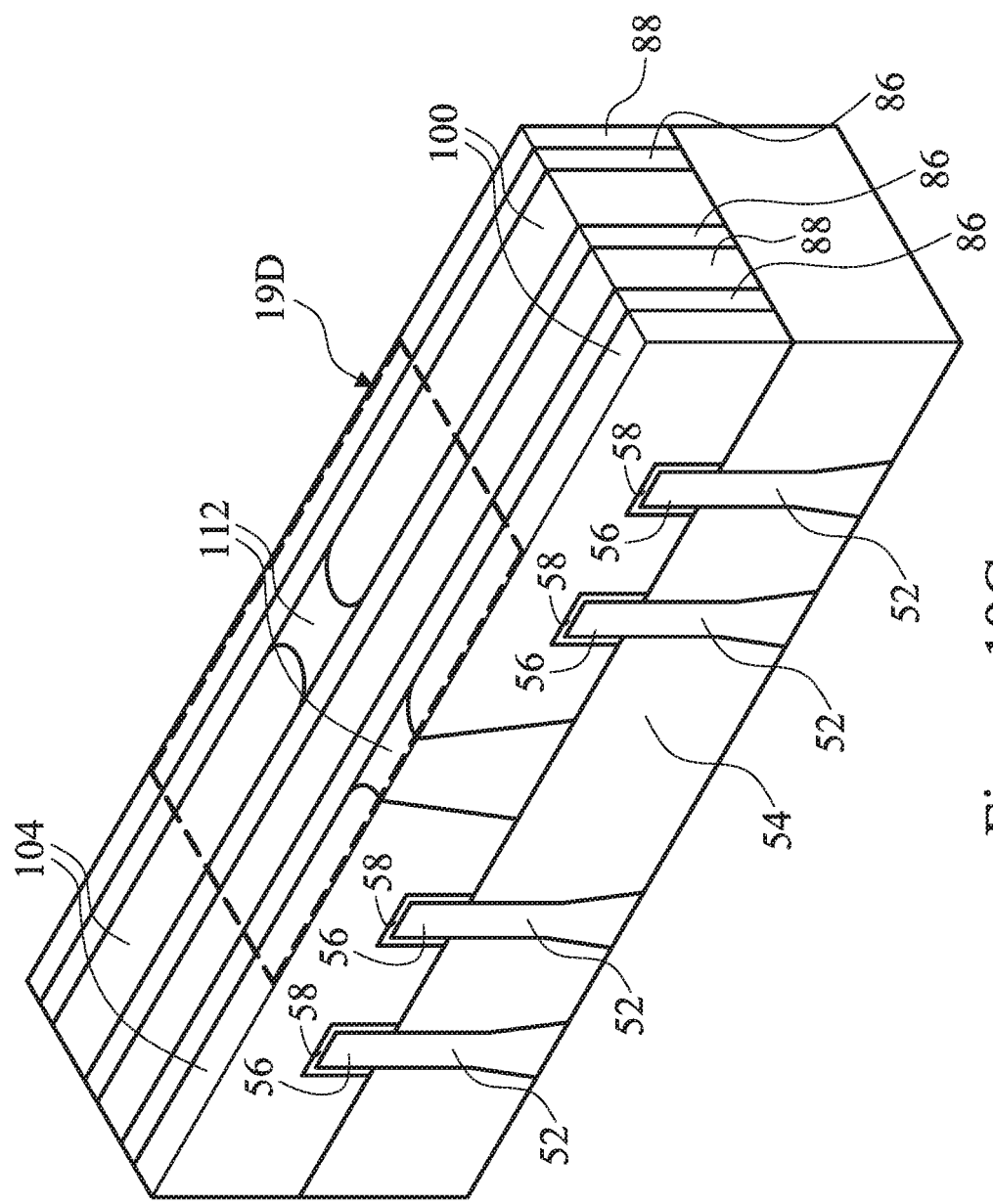
Figure 19D:
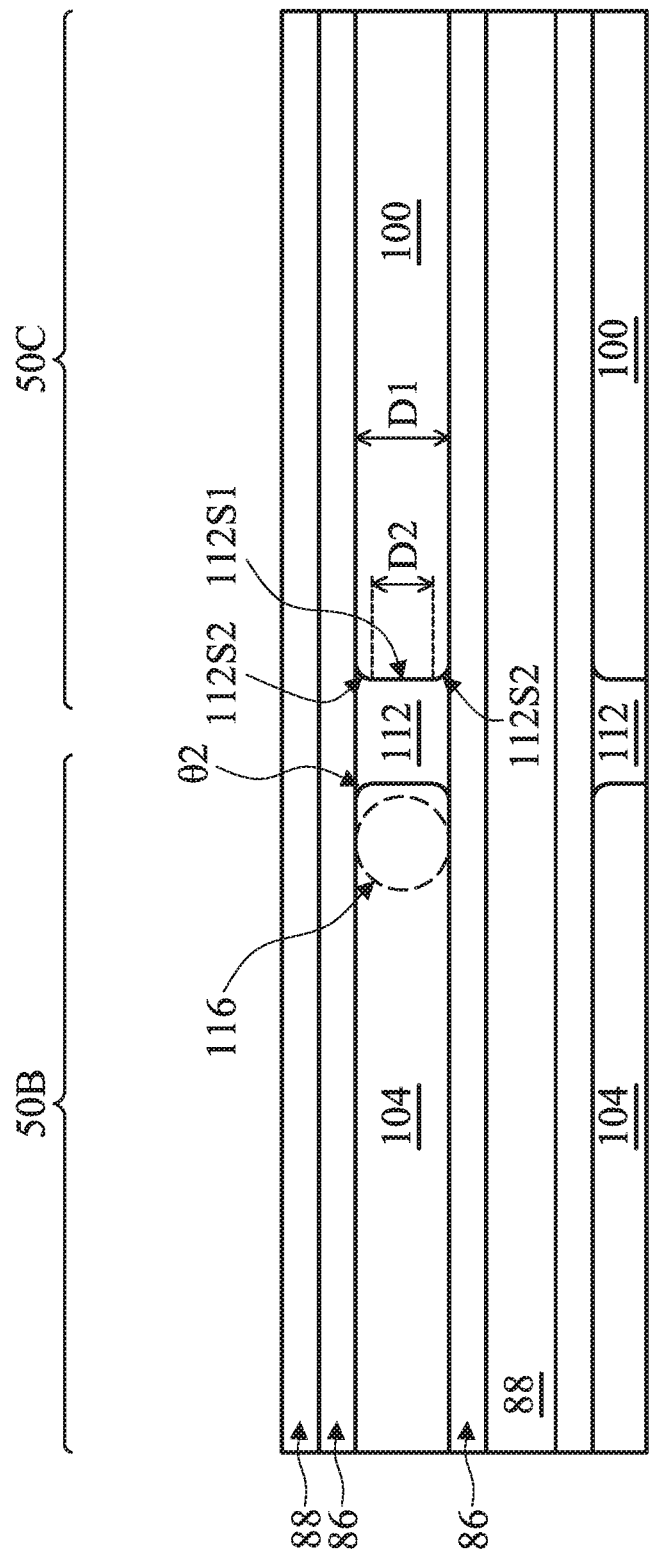

In FIGS. 18A, 18B, and 18C, the remaining portions 96 are removed to form recesses 110. The remaining portions 96 may be removed by using an acceptable etching process, such as one that is selective to the material of the remaining portions 96 without etching the gate electrodes 100 and 104 isolation region 54. The recesses 110 are defined by the exposed surfaces of the isolation regions 54, the exposed sidewalls of the replacement gates, and the exposed sidewalls of the gate spacers 86.

In FIGS. 19A, 19B, 19C, and 19D, an insulation material 112 is formed in the recesses between neighboring replacement gates to form the isolation regions 112. The isolation regions 112 provide isolation between the replacement gates in the first region 50B and the replacement gates in the second region 50C. The insulation material 112 may be an oxide, such as silicon oxide, a nitride, the like, or a combination thereof, and may be formed by a HDP-CVD, FCVD (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 112 is silicon oxide formed by a FCVD process. Further in FIGS. 19A, 19B, 19C, and 19D, a planarization process, such as a CMP process, may remove any excess insulation material 112 and form top surfaces of the isolation regions 112 and top surfaces of the replacement gates and ILD 88 that are level.

The isolation regions 112 have sidewalls 112S between the neighboring gate spacers 86 that have the angle θ1 with a plane parallel to the major surface of the substrate 50 similar to the corresponding sidewall 96S of the remaining portion 96. Further, the sidewalls 112S of the isolation regions 112 are not planar, but rather are concave in a top-view with the isolation regions 112 being wider in the top-view nearer the gate spacers 86. In the top-view, the isolation regions have an hourglass shape. In some embodiments, as illustrated in the top-view of FIG. 19D, the sidewalls 112S have a middle portion 112S1 that is substantially planar with edge portions 112S2 that are curved (e.g. not planar). In these embodiments, the distance in the top-view between neighboring gate spacers 86 is a distance D1 with the middle portions 112S1 of the sidewalls 112S of the isolation regions 112 having a distance D2 in the top-view. In an embodiment, the distance D2 is in a range from about one third of the distance D1 to about the entire distance D1. In some embodiments, the curved portions 112S2 of the sidewalls 112S of the isolation regions 112 meet the sidewalls of the gate spacers 86 at an angle θ2 relative to the sidewalls of the gate spacers 86. In an embodiment, the angle θ2 is in a range from about 45° to about 90°. Further, as measured in a direction parallel to longitudinal axes of the gates 100 and 104, the isolation regions 112 are wider at their interfaces with the isolation regions 54 (i.e. bottom surfaces of isolation regions 112) than at their top surfaces, such that the remaining portions taper from the bottom towards the top.

The concave shape of the sidewalls 112S of the isolation regions 112 in the top-view is significant as it helps to reduce the chances of landing an overlying contact on the isolation region 112, which would affect the performance of the device due to the increase resistance of the overlying contact. For example, FIG. 19D illustrates the landing footprint of an overlying contact 116 on the gate electrode 104. As illustrated the landing footprint of an overlying contact 116 is typically round, and thus, the concave shape of the sidewall 112S of the isolation region 112 reduces the chances that the overlying contact 116 will land on the isolation region 112. Said another way, the concave shape of the sidewall 112S of the isolation region 112 increases the contact landing window for the overlying contact 116 as compared to other shapes of the of the sidewall 112S of the isolation region 112, such as a convex shape. Further, the overall width of the exposed top surface of the isolation region 112 is reduced due to the ability to trim the photoresist 92 (see FIGS. 13A, 13B, and 13C and corresponding paragraphs) beyond the limits of current lithography. This reduced overall width of the exposed top surface of the isolation region 112 further reduces the chances that the overlying contact 116 will land on the isolation region 112, and thus, increases the contact landing window for the overlying contact 116. Even further, the concave shape of the sidewall 112S of the isolation region 112 reduces the likelihood of a void forming between the isolation region 112 and the gate spacer 86 during the formation of the replacement gate electrode 100 and 104.

Figure 20A:
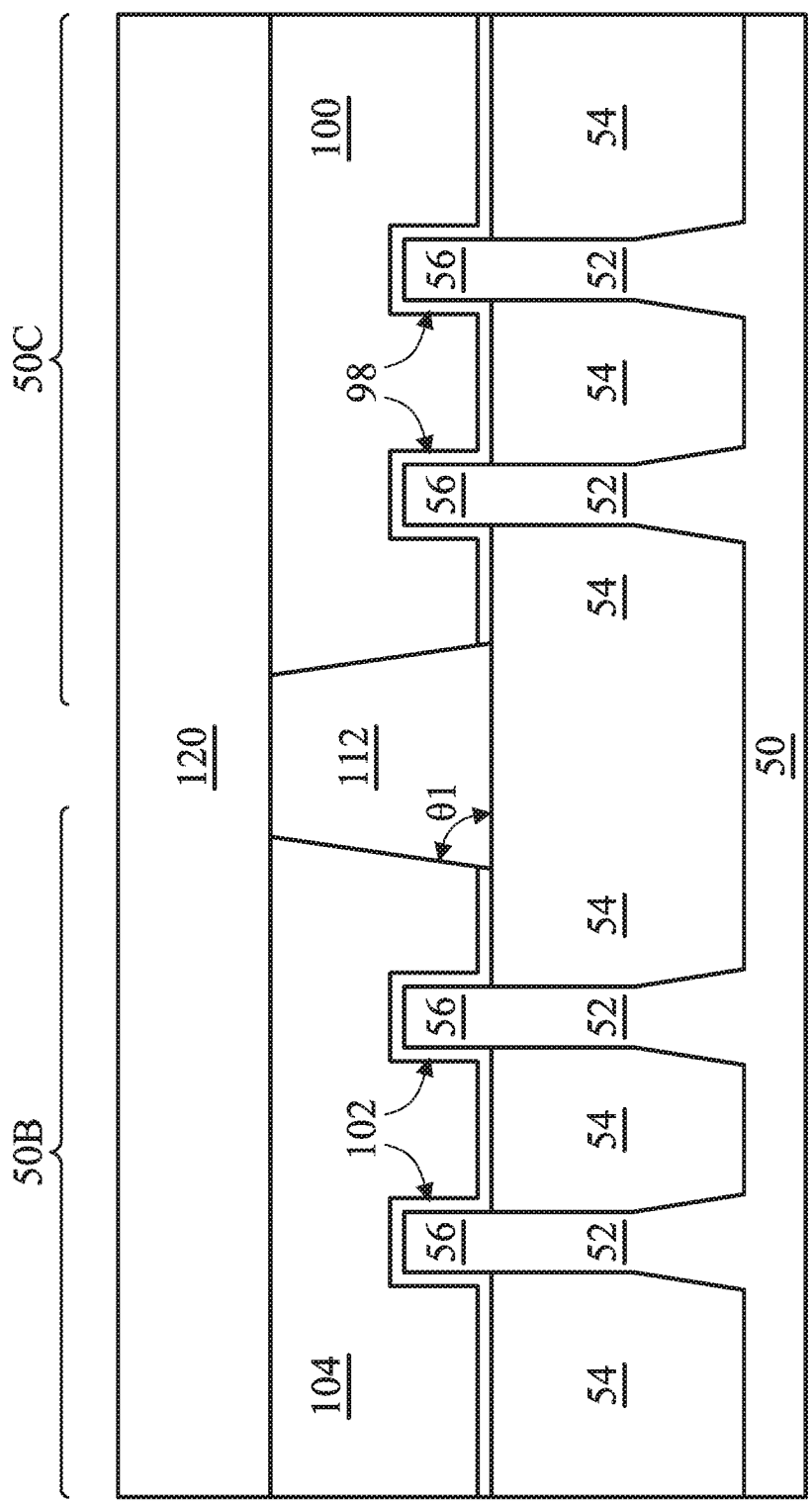
Figure 20B:
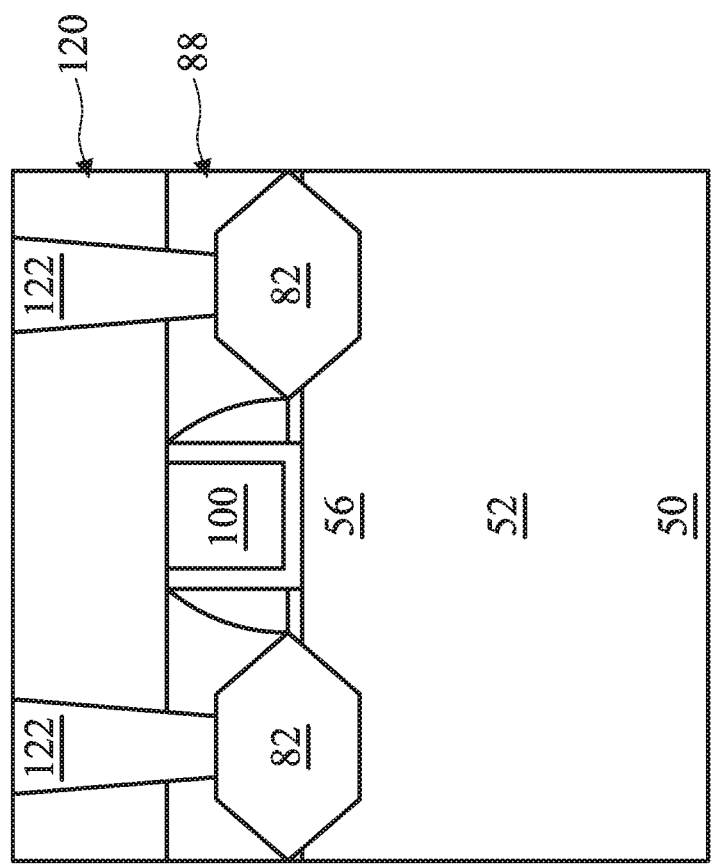

In FIGS. 20A and 20B, an ILD 120 is deposited over ILD 88, and contacts 122 are formed through ILD 118 and ILD 88. The ILD 120 is formed over the ILD 88, the replacement gates, the gate spacers 86, and the isolation regions 112. The ILD 120 is formed of a dielectric material such as PSG, BSG, BPSG, USG, or the like, and may be deposited by any suitable method, such as CVD and PECVD. Openings for contacts 122 are formed through the ILDs 88 and 120. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 120. The remaining liner and conductive material form contacts 122 in the openings. An anneal process may be performed to form a silicide at the interface between the epitaxial source/drain regions 82 and the contacts 122, respectively. Contacts 122 are physically and electrically coupled to the epitaxial source/drain regions 82.

Although not explicitly shown, a person having ordinary skill in the art will readily understand that further processing steps may be performed on the structure in FIGS. 20A and 20B. For example, various Inter-Metal Dielectrics (IMD) and their corresponding metallizations may be formed over ILD 120.

Embodiments of the present disclosure may achieve advantages, such as providing isolation between gates in neighboring regions while reducing the chances of landing an overlying contact on the isolation region. In particular, the sidewalls of the isolation regions have a concave shape in the top-view, which is significant as it helps to reduce the chances of landing an overlying contact on the isolation region, which would affect the performance of the device due to the increase resistance of the overlying contact. For example, the landing footprint of an overlying contact is typically round, and thus, the concave shape of the sidewall of the isolation region reduces the chances that the overlying contact will land on the isolation region. Said another way, the concave shape of the sidewall of the isolation region increases the contact landing window for the overlying contact as compared to other shapes of the of the sidewall of the isolation region, such as a convex shape. Further, the overall width of the exposed top surface of the isolation region is reduced due to the ability to trim the photoresist that determines the width of the isolation region beyond the limits of current lithography. This reduced overall width of the exposed top surface of the isolation region further reduces the chances that the overlying contact will land on the isolation region, and thus, increases the contact landing window for the overlying contact. Even further, the concave shape of the sidewall of the isolation region reduces the likelihood of a void forming between the isolation region and the gate spacer during the formation of the replacement gate electrode.

An embodiment is a method including forming a first fin in a first region of a substrate and a second fin in a second region of the substrate, forming a first isolation region on the substrate, the first isolation region surrounding the first fin and the second fin, forming a first dummy gate over the first fin and a second dummy gate over the second fin, the first dummy gate and the second dummy gate having a same longitudinal axis, replacing the first dummy gate with a first replacement gate and the second dummy gate with a second replacement gate, forming a first recess between the first replacement gate and the second replacement gate, and a filling an insulating material in the first recess to form a second isolation region.

Another embodiment is a method including forming a first fin and a second fin over a substrate, forming a first isolation region on the substrate, the first isolation region surrounding the first and second fins, forming a first dummy gate stack over a top surface and sidewalls of the first and second fins, the first dummy gate stack having a first longitudinal axis, patterning the first dummy gate stack to expose channel regions of the first and second fins while leaving a first portion of the first dummy gate stack between the first and second fins, forming a first replacement gate stack over the exposed channel region of the first fin, forming a second replacement gate stack over the exposed channel region of the second fin, and replacing the first portion of the first dummy gate stack with a dielectric material to form a second isolation region.

A further embodiment is a structure including a first fin over substrate and a second fin over the substrate, a first isolation region on the substrate, the first isolation region surrounding the first and second fins, a first gate stack over the first fin and a second gate stack over the second fin, the first gate stack and the second gate stack having a same longitudinal axis, and a second isolation region interposed between the first and second gate stacks, the second isolation region tapering from a bottom surface towards a top surface, the bottom surface of the second isolation region being proximate the first isolation region, the top surface of the second isolation region being distal the first isolation region.

A further embodiment is a structure including a first fin and a second fin over a substrate, a first isolation region over the substrate, the first isolation region being interposed between the first fin and the second fin, a first gate stack over the first fin, the first gate stack having a first non-planar sidewall, a second gate stack over the second fin, the second gate stack having a second non-planar sidewall, the second non-planar sidewall facing the first non-planar sidewall, and a second isolation region over the first isolation region, the second isolation region being interposed between the first non-planar sidewall of the first gate stack and the second non-planar sidewall of the second gate stack.

A further embodiment is a structure including a first fin and a second fin extending above a topmost surface of a first isolation region, a first gate stack extending along sidewalls and a top surface of the first fin, the first gate stack having a first convex sidewall, a second gate stack extending along sidewalls and a top surface of the second fin, the second gate stack having a second convex sidewall, the second convex sidewall facing the first convex sidewall, and a second isolation region in physical contact with the topmost surface of the first isolation region, the second isolation region separating the first convex sidewall of the first gate stack from the second convex sidewall of the second gate stack.

A further embodiment is a structure including a first fin and a second fin over a substrate, a first isolation region over the substrate, the first isolation region being interposed between the first fin and the second fin, a topmost surface of the first fin and a topmost surface of the second fin being above a topmost surface of the first isolation region, a first gate stack over the first fin, the first gate stack having a first longitudinal axis, a second gate stack over the second fin, the second gate stack having a second longitudinal axis collinear with the first longitudinal axis, a first width of the first gate stack and a second width of the second gate stack decreasing as the first gate stack and the second gate stack extend toward each other, and a second isolation region over the first isolation region, the second isolation region being interposed between the first gate stack and the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first fin and a second fin over a substrate;
   a first isolation region over the substrate, the first isolation region being interposed between the first fin and the second fin;
   a first gate stack over the first fin, the first gate stack having a first non-planar sidewall;
   a second gate stack over the second fin, the second gate stack having a second non-planar sidewall, the second non-planar sidewall facing the first non-planar sidewall; and
   a second isolation region over the first isolation region, the second isolation region being interposed between the first non-planar sidewall of the first gate stack and the second non-planar sidewall of the second gate stack.

2. The structure of claim 1, wherein the first non-planar sidewall of the first gate stack forms an angle relative to a top surface of the first isolation region, the angle being less than about 90°.

3. The structure of claim 1, wherein the second isolation region is in physical contact with the first non-planar sidewall of the first gate stack and the second non-planar sidewall of the second gate stack.

4. The structure of claim 1, wherein the second isolation region is in physical contact with the first isolation region.

5. The structure of claim 1, wherein a top surface of the second isolation region is substantially level with a top surface of the first gate stack and a top surface of the second gate stack.

6. The structure of claim 1, further comprising a dielectric layer over and in physical contact with the first gate stack, the second gate stack, and the second isolation region.

7. The structure of claim 1, further comprising a spacer adjacent the first gate stack, wherein the first non-planar sidewall of the first gate stack forms an angle relative to a sidewall of the spacer, the angle being between about 45° and about 90°.

8. A structure comprising:
   a first fin and a second fin extending above a topmost surface of a first isolation region;
   a first gate stack extending along sidewalls and a top surface of the first fin, the first gate stack having a first convex sidewall;
   a second gate stack extending along sidewalls and a top surface of the second fin, the second gate stack having a second convex sidewall, the second convex sidewall facing the first convex sidewall; and
   a second isolation region in physical contact with the topmost surface of the first isolation region, the second isolation region separating the first convex sidewall of the first gate stack from the second convex sidewall of the second gate stack.

9. The structure of claim 8, wherein a bottom surface of the second isolation region is wider than a top surface of the second isolation region, the bottom surface of the second isolation region being in physical contact with the topmost surface of the first isolation region.

10. The structure of claim 8, wherein the first convex sidewall of the first gate stack forms an angle relative to a topmost surface of the first isolation region, the angle being between about 75° and about 89°.

11. The structure of claim 8, wherein the second isolation region tapers from a bottom surface towards a top surface, the bottom surface of the second isolation region being proximate the first isolation region, the top surface of the second isolation region being distal the first isolation region.

12. The structure of claim 8, further comprising a dielectric layer in physical contact with a top surface of the first gate stack, a top surface of the second gate stack, and a top surface of the second isolation region.

13. The structure of claim 8, further comprising a spacer adjacent and in physical contact with the first gate stack and the second gate stack.

14. The structure of claim 13, wherein the second isolation region is in physical contact with the spacer.

15. A structure comprising:
   a first fin and a second fin over a substrate;
   a first isolation region over the substrate, the first isolation region being interposed between the first fin and the second fin, a topmost surface of the first fin and a topmost surface of the second fin being above a topmost surface of the first isolation region;
   a first gate stack over the first fin, the first gate stack having a first longitudinal axis;
   a second gate stack over the second fin, the second gate stack having a second longitudinal axis collinear with the first longitudinal axis, a first width of the first gate stack and a second width of the second gate stack decreasing as the first gate stack and the second gate stack extend toward each other; and a second isolation region over the first isolation region, the second isolation region being interposed between the first gate stack and the second gate stack.

16. The structure of claim 15, wherein the first gate stack has a first convex sidewall, wherein the second gate stack has a second convex sidewall, and wherein the first convex sidewall of the first gate stack faces the second convex sidewall of the second gate stack.

17. The structure of claim 16, wherein the second isolation region has a first concave sidewall and a second concave sidewall, and wherein the first concave sidewall of the second isolation region is opposite the second concave sidewall of the second isolation region.

18. The structure of claim 17, wherein the first concave sidewall of the second isolation region is in physical contact with the first convex sidewall of the first gate stack, and wherein the second concave sidewall of the second isolation region is in physical contact with the second convex sidewall of the second gate stack.

19. The structure of claim 15, wherein a first gate electrode of the first gate stack and a second gate electrode of the second gate stack comprise different materials.

20. The structure of claim 15, further comprising a spacer in physical contact with the first gate stack, the second gate stack, and the second isolation region.

* * * * *